(12) United States Patent
Widmer et al.

(10) Patent No.: US 10,670,764 B2
(45) Date of Patent: *Jun. 2, 2020

(54) SYSTEMS, METHODS, AND APPARATUS FOR DETECTING FERROMAGNETIC FOREIGN OBJECTS IN A PREDETERMINED SPACE

(71) Applicant: WiTricity Corporation, Watertown, MA (US)

(72) Inventors: Hans Peter Widmer, Wohlenschwil (CH); Lukas Sieber, Olten (CH); Andreas Daetwyler, Unterentfelden (CH)

(73) Assignee: WiTricity Corporation, Watertown, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/398,151

(22) Filed: Apr. 29, 2019

(65) Prior Publication Data

US 2019/0250298 A1 Aug. 15, 2019

Related U.S. Application Data

(60) Division of application No. 14/723,358, filed on May 27, 2015, now Pat. No. 10,302,795, which is a
(Continued)

(51) Int. Cl.
*G01V 3/10* (2006.01)
*H02J 50/60* (2016.01)
(Continued)

(52) U.S. Cl.
CPC ............... *G01V 3/101* (2013.01); *G01V 3/10* (2013.01); *H02J 50/60* (2016.02); *G01R 27/02* (2013.01); *G01V 3/38* (2013.01)

(58) Field of Classification Search
CPC .. G01V 3/10; G01V 3/101; G01V 3/38; H02J 50/60; G01R 27/02
(Continued)

(56) References Cited

U.S. PATENT DOCUMENTS

| | | |
|---|---|---|
| 3,018,395 A | 1/1962 | Carlstein |
| 5,519,317 A | 5/1996 | Guichard et al. |

(Continued)

FOREIGN PATENT DOCUMENTS

| | | |
|---|---|---|
| CA | 2766854 A1 | 1/2011 |
| CN | 102439669 A | 5/2012 |

(Continued)

OTHER PUBLICATIONS

International Search Report and Written Opinion—PCT/US2015/063776—ISA/EPO—dated Feb. 9, 2016.
(Continued)

*Primary Examiner* — Melissa J Koval
*Assistant Examiner* — Courtney G McDonnough
(74) *Attorney, Agent, or Firm* — Knobbe Martens Olson & Bear LLP

(57) ABSTRACT

One aspect of the disclosure provides apparatus for detecting an object. The apparatus comprises a sense coil. The apparatus comprises a processor configured to determine an amount of change in a reactance of the sense coil from a previous reactance value for the sense coil. The processor is configured to determine an amount of change in a resistance of the sense coil from a previous resistance value for the sense coil. The processor is configured to determine a presence of the object based on a relationship between the amount of change in the reactance of the sense coil and the amount of change in the resistance of the sense coil. The processor performs an inverse tangent operation on a quotient of the amount of change in the reactance of the sense
(Continued)

coil divided by the amount of change in the resistance of the sense coil.

12 Claims, 17 Drawing Sheets

Related U.S. Application Data continuation-in-part of application No. 14/720,539, filed on May 22, 2015, now Pat. No. 10,324,215.

(60) Provisional application No. 62/098,273, filed on Dec. 30, 2014.

(51) Int. Cl.
 *G01R 27/02* (2006.01)
 *G01V 3/38* (2006.01)

(58) Field of Classification Search
 USPC .......................................................... 324/227
 See application file for complete search history.

(56) References Cited

U.S. PATENT DOCUMENTS

| | | | |
|---|---|---|---|
| 6,216,540 B1 | 4/2001 | Nelson et al. | |
| 6,864,108 B1 | 3/2005 | Papa et al. | |
| 7,705,589 B2 | 4/2010 | Kim et al. | |
| 7,994,778 B2 | 8/2011 | Kirchdoerffer et al. | |
| 8,193,806 B2 | 6/2012 | Jamaguchi et al. | |
| 8,618,794 B2 | 12/2013 | Ask et al. | |
| 10,302,795 B2 | 5/2019 | Widmer et al. | |
| 10,324,215 B2 | 6/2019 | Widmer et al. | |
| 2003/0160617 A1* | 8/2003 | Rowan .................. | G01V 3/104 324/329 |
| 2009/0261778 A1 | 10/2009 | Kook | |
| 2010/0060270 A1 | 3/2010 | Gong et al. | |
| 2010/0134096 A1 | 6/2010 | Chiba et al. | |
| 2010/0259217 A1 | 10/2010 | Baarman | |
| 2010/0277121 A1 | 11/2010 | Hall et al. | |
| 2011/0128015 A1 | 6/2011 | Dorairaj et al. | |
| 2011/0251809 A1 | 10/2011 | Stollenwerk | |
| 2012/0011534 A1 | 1/2012 | Mukerji et al. | |
| 2012/0112534 A1 | 5/2012 | Kesler et al. | |
| 2012/0112691 A1 | 5/2012 | Kurs et al. | |
| 2012/0119576 A1 | 5/2012 | Kesler et al. | |
| 2012/0146580 A1 | 6/2012 | Kitamura | |
| 2012/0175967 A1 | 7/2012 | Dibben et al. | |
| 2012/0176085 A1 | 7/2012 | Iida et al. | |
| 2012/0181875 A1 | 7/2012 | Wechlin et al. | |
| 2012/0187757 A1 | 7/2012 | Wechlin et al. | |
| 2012/0206138 A1 | 8/2012 | Derungs | |
| 2013/0099592 A1 | 4/2013 | Abe | |
| 2013/0162054 A1 | 6/2013 | Komiyama | |
| 2013/0176023 A1 | 7/2013 | Komiyama | |
| 2013/0181724 A1 | 7/2013 | Teggatz | |
| 2013/0193771 A1 | 8/2013 | Teggatz | |
| 2013/0249682 A1 | 9/2013 | Van Wiemeersch et al. | |
| 2013/0264887 A1 | 10/2013 | Arisawa | |
| 2013/0307346 A1* | 11/2013 | Arisawa .................. | H01F 38/14 307/104 |
| 2014/0015329 A1 | 1/2014 | Widmer et al. | |
| 2014/0015522 A1 | 1/2014 | Widmer et al. | |
| 2014/0111019 A1 | 4/2014 | Roy et al. | |
| 2014/0167704 A1 | 6/2014 | Lafontaine et al. | |
| 2014/0247040 A1 | 9/2014 | Reitsma et al. | |
| 2015/0109000 A1 | 4/2015 | Sieber et al. | |
| 2015/0331135 A1 | 11/2015 | Widmer | |
| 2016/0172891 A1 | 6/2016 | Filippenko et al. | |
| 2016/0187519 A1 | 6/2016 | Widmer et al. | |
| 2016/0187520 A1 | 6/2016 | Widmer et al. | |
| 2019/0293827 A1 | 9/2019 | Widmer et al. | |
| 2019/0293829 A1 | 9/2019 | Widmer et al. | |

FOREIGN PATENT DOCUMENTS

| | | |
|---|---|---|
| CN | 102457107 A | 5/2012 |
| CN | 102694423 A | 9/2012 |
| CN | 102804541 A | 11/2012 |
| CN | 102998711 A | 3/2013 |
| CN | 103053093 A | 4/2013 |
| CN | 103199632 A | 7/2013 |
| CN | 103308949 A | 9/2013 |
| CN | 103368277 A | 10/2013 |
| EP | 0782012 | 7/1997 |
| EP | 2378316 A | 10/2011 |
| GB | 2025630 A | 1/1980 |
| JP | S5430076 A | 3/1979 |
| JP | S56154687 A | 11/1981 |
| JP | S57113362 A | 7/1982 |
| JP | S61250920 A | 11/1986 |
| JP | H03194818 A | 8/1991 |
| JP | H0821880 A | 1/1996 |
| JP | 2000134830 A | 5/2000 |
| JP | 2004184257 A | 7/2004 |
| JP | 2004191223 A | 7/2004 |
| JP | 2007199060 A | 8/2007 |
| JP | 2008232999 A | 10/2008 |
| JP | 2009229261 A | 10/2009 |
| JP | 2010181300 A | 8/2010 |
| JP | 2012016125 A | 1/2012 |
| JP | 2012523814 A | 10/2012 |
| JP | 2012533277 A | 12/2012 |
| JP | 2013132133 A | 7/2013 |
| JP | 2013135518 A | 7/2013 |
| JP | 2013208012 A | 10/2013 |
| WO | WO-2011006758 | 1/2011 |
| WO | WO-2012165244 A1 | 12/2012 |
| WO | WO-2013127445 A1 | 9/2013 |
| WO | WO-2014095722 | 6/2014 |
| WO | WO-2014136396 A1 | 9/2014 |

OTHER PUBLICATIONS

Kesler M., "Highly Resonant Wireless Power Transfer: Safe, Efficient, and over Distance", WiTricity Corporation, 2013, available on line at http://www.witricity.com/assets/highly-resonantpower-transfer-kesler-witricity-2013.pdf, 32 pages.

Serway et al. "Physics for Scientists and Engineers", vol. 2, Chapters 23-46, Seventh Edition, Thompson Learning, Inc. 2008, p. 884 (in 3 parts).

Chinese Office Action dated Sep. 30, 2019 in Application No. 201580071791.

Japanese Office Action dated Nov. 5, 2019 in Application No. 2017-533441.

* cited by examiner

SYSTEMS, METHODS, AND APPARATUS FOR DETECTING FERROMAGNETIC FOREIGN OBJECTS IN A PREDETERMINED SPACE

CROSS REFERENCE TO RELATED APPLICATIONS

The present Application for patent is a divisional of and claims priority to Non-Provisional application Ser. No. 14/723,358 entitled "SYSTEMS, METHODS, AND APPARATUS FOR DETECTING FERROMAGNETIC FOREIGN OBJECTS IN A PREDETERMINED SPACE" filed May 27, 2015, which is a continuation-in-part of Non-Provisional application Ser. No. 14/720,539 entitled "SYSTEMS, METHODS, AND APPARATUS FOR DETECTING FERROMAGNETIC FOREIGN OBJECTS IN A PREDETERMINED SPACE" filed May 22, 2015, which claims priority to Provisional Application No. 62/098,273 entitled "SYSTEMS, METHODS, AND APPARATUS FOR DETECTING FERROMAGNETIC FOREIGN OBJECTS IN A PREDETERMINED SPACE" filed Dec. 30, 2014, the contents of which are hereby incorporated in their entireties by reference herein.

FIELD

The present disclosure relates generally to wireless power transfer, and more specifically to devices, systems, and methods for detecting ferromagnetic foreign objects in a predetermined space.

BACKGROUND

Remote systems, such as vehicles, have been introduced that include locomotion power derived from electricity received from an energy storage device such as a battery. Such energy storage devices need to be periodically charged. For example, hybrid electric vehicles include on-board chargers that use power from vehicle braking and traditional motors to charge the vehicles. Battery electric vehicles (electric vehicles) are often proposed to be charged through some type of wired alternating current (AC) such as household or commercial AC supply sources. The wired charging connections require cables or other similar connectors that are physically connected to a power supply. Cables and similar connectors may sometimes be inconvenient or cumbersome and have other drawbacks. Wireless charging systems that are capable of transferring power in free space (e.g., via an electromagnetic field) to be used to charge electric vehicles may overcome some of the deficiencies of wired charging solutions. However, using electromagnetic fields may induce eddy currents in a well conducting (e.g., metallic or ferromagnetic) object located within the field, potentially causing the object to heat up, vibrate or cause a nearby object to melt or catch fire. As such, wireless charging systems and methods that efficiently and safely transfer power for charging electric vehicles are desirable.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides apparatus for detecting an object. The apparatus comprises a sense coil. The apparatus comprises a processor configured to determine an amount of change in a reactance of the sense coil from a previous reactance value for the sense coil. The processor is configured to determine an amount of change in a resistance of the sense coil from a previous resistance value for the sense coil. The processor is configured to determine a presence of the object based on a relationship between the amount of change in the reactance of the sense coil and the amount of change in the resistance of the sense coil.

Another aspect of the disclosure provides a method for detecting a presence of an object. The method comprises determining an amount of change in a reactance of a sense coil from a previous reactance value for the sense coil. The method further comprises determining an amount of change in a resistance of the sense coil from a previous resistance value for the sense coil. The method further comprises determining a presence of the object based on a relationship between the amount of change in the reactance of the sense coil and the amount of change in the resistance of the sense coil.

Yet another aspect of the disclosure provides a non-transitory, computer-readable medium comprising code that, when executed, causes an apparatus for detecting an object to determine an amount of change in a reactance of a sense coil from a previous reactance value for the sense coil. The code, when executed, further causes the apparatus to determine an amount of change in a resistance of the sense coil from a previous resistance value for the sense coil. The code, when executed, further causes the apparatus to determine a presence of the object based on a relationship between the amount of change in the reactance of the sense coil and the amount of change in the resistance of the sense coil.

Yet another aspect of the disclosure provides an apparatus for detecting a presence of an object. The apparatus comprises means for sensing an object. The apparatus further comprises means for determining an amount of change in a reactance of the means for sensing the object from a previous reactance value for the means for sensing the object. The apparatus further comprises means for determining an amount of change in a resistance of the means for sensing the object from a previous resistance value for the means for sensing the object. The apparatus further comprises means for determining a presence of the object based on a relationship between the amount of change in the reactance of the means for sensing the object and the amount of change in the resistance of the means for sensing the object.

Figure 1:
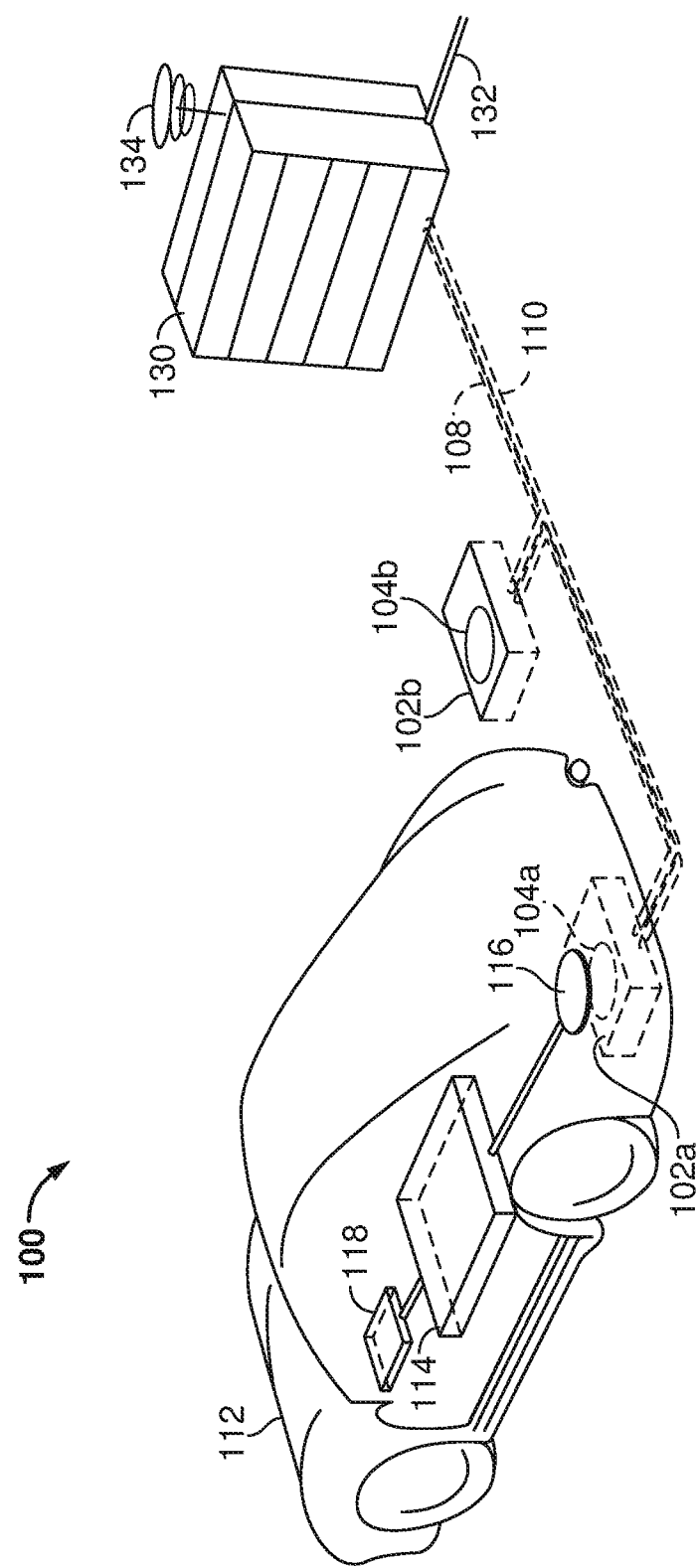
FIG. 1 is a diagram of a wireless power transfer system for charging an electric vehicle, in accordance with some implementations.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of implementations and is not intended to represent the only implementations in which the invention may be practiced. The term "exemplary" used throughout this description means "serving as an example, instance, or illustration," and should not necessarily be construed as preferred or advantageous over other implementations. The detailed description includes specific details for the purpose of providing a thorough understanding of the implementations. In some instances, some devices are shown in block diagram form.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into an electro-magnetic field (e.g., a magnetic field) may be received, captured by, or coupled by a "receiving coupler" to achieve power transfer.

An electric vehicle is used herein to describe a remote system, an example of which is a vehicle that includes, as part of its locomotion capabilities, electrical power derived from a chargeable energy storage device (e.g., one or more rechargeable electrochemical cells or other type of battery). As non-limiting examples, some electric vehicles may be hybrid electric vehicles that include besides electric motors, a traditional combustion engine for direct locomotion or to charge the vehicle's battery. Other electric vehicles may draw all locomotion ability from electrical power. An electric vehicle is not limited to an automobile and may include motorcycles, carts, scooters, and the like. By way of example and not limitation, a remote system is described herein in the form of an electric vehicle (EV). Furthermore, other remote systems that may be at least partially powered using a chargeable energy storage device are also contemplated (e.g., electronic devices such as personal computing devices and the like).

FIG. 1 is a diagram of an wireless power transfer system 100 for charging an electric vehicle 112, in accordance with some implementations. The wireless power transfer system 100 enables charging of an electric vehicle 112 while the electric vehicle 112 is parked near a base wireless charging system 102a. Spaces for two electric vehicles are illustrated in a parking area to be parked over corresponding base wireless charging system 102a and 102b. In some implementations, a local distribution center 130 may be connected to a power backbone 132 and configured to provide an alternating current (AC) or a direct current (DC) supply through a power link 110 to the base wireless charging system 102a. The base wireless charging system 102a also includes a base system coupler 104a for wirelessly transferring or receiving power. An electric vehicle 112 may include a battery unit 118, an electric vehicle coupler 116, and an electric vehicle wireless charging system 114. Each of the base wireless charging systems 102a and 102b also includes a base coupler 104a and 104b, respectively, for wirelessly transferring power. In some other implementations (not shown in FIG. 1), base couplers 104a or 104b may be stand-alone physical units and are not part of the base wireless charging system 102a or 102b. The electric vehicle coupler 116 may interact with the base system coupler 104a for example, via a region of the electromagnetic field generated by the base system coupler 104a.

In some implementations, the electric vehicle coupler 116 may receive power when the electric vehicle coupler 116 is located in an energy field produced by the base system coupler 104a. The field corresponds to a region where energy output by the base system coupler 104a may be captured by an electric vehicle coupler 116. For example, the energy output by the base system coupler 104a may be at a level sufficient to charge or power the electric vehicle 112. In some cases, the field may correspond to the "near field" of the base system coupler 104a. The near-field may correspond to a region in which there are strong reactive fields resulting from the currents and charges in the base system coupler 104a that do not radiate power away from the base system coupler 104a. In some cases the near-field may correspond to a region that is within about $\frac{1}{2}\pi$ of wavelength of the base system coupler 104a (and vice versa for the electric vehicle coupler 116) as will be further described below.

Local distribution 130 may be configured to communicate with external sources (e.g., a power grid) via a communication backhaul 134, and with the base wireless charging system 102a via a communication link 108.

In some implementations the electric vehicle coupler 116 may be aligned with the base system coupler 104a and, therefore, disposed within a near-field region simply by the driver positioning the electric vehicle 112 correctly relative to the base system coupler 104a. In other implementations, the driver may be given visual, auditory, or tactile feedback, or combinations thereof to determine when the electric vehicle 112 is properly placed for wireless power transfer. In yet other implementations, the electric vehicle 112 may be positioned by an autopilot system, which may move the electric vehicle 112 back and forth (e.g., in zig-zag movements) until an alignment error has reached a tolerable value. This may be performed automatically and autonomously by the electric vehicle 112 without or with only minimal driver intervention provided that the electric vehicle 112 is equipped with a servo steering wheel, ultrasonic sensors, and intelligence to adjust the vehicle. In still other implementations, the electric vehicle coupler 116, the base system coupler 104a, or a combination thereof may have functionality for displacing and moving the couplers 116 and 104a relative to each other to more accurately orient them and develop more efficient coupling therebetween.

The base wireless charging system 102a may be located in a variety of locations. As non-limiting examples, some suitable locations include a parking area at a home of the electric vehicle 112 owner, parking areas reserved for electric vehicle wireless charging modeled after conventional petroleum-based filling stations, and parking lots at other locations such as shopping centers and places of employment.

Charging electric vehicles wirelessly may provide numerous benefits. For example, charging may be performed automatically, virtually without driver intervention and manipulations thereby improving convenience to a user. There may also be no exposed electrical contacts and no mechanical wear out, thereby improving reliability of the wireless power transfer system 100. Manipulations with cables and connectors may not be needed, and there may be no cables, plugs, or sockets that may be exposed to moisture and water in an outdoor environment, thereby improving safety. There may also be no sockets, cables, and plugs visible or accessible, thereby reducing potential vandalism of power charging devices. Further, since an electric vehicle 112 may be used as distributed storage devices to stabilize a power grid, a docking-to-grid solution may be used to increase availability of vehicles for Vehicle-to-Grid (V2G) operation.

A wireless power transfer system 100 as described with reference to FIG. 1 may also provide aesthetic and non-impedimental advantages. For example, there may be no charge columns and cables that may be impedimental for vehicles and/or pedestrians.

As a further explanation of the vehicle-to-grid capability, the wireless power transmit and receive capabilities may be configured to be reciprocal such that the base wireless charging system 102a transfers power to the electric vehicle 112 and the electric vehicle 112 transfers power to the base wireless charging system 102a, e.g., in times of energy shortfall. This capability may be useful to stabilize the power distribution grid by allowing electric vehicles to contribute power to the overall distribution system in times of energy shortfall caused by over demand or shortfall in renewable energy production (e.g., wind or solar).

Figure 2:
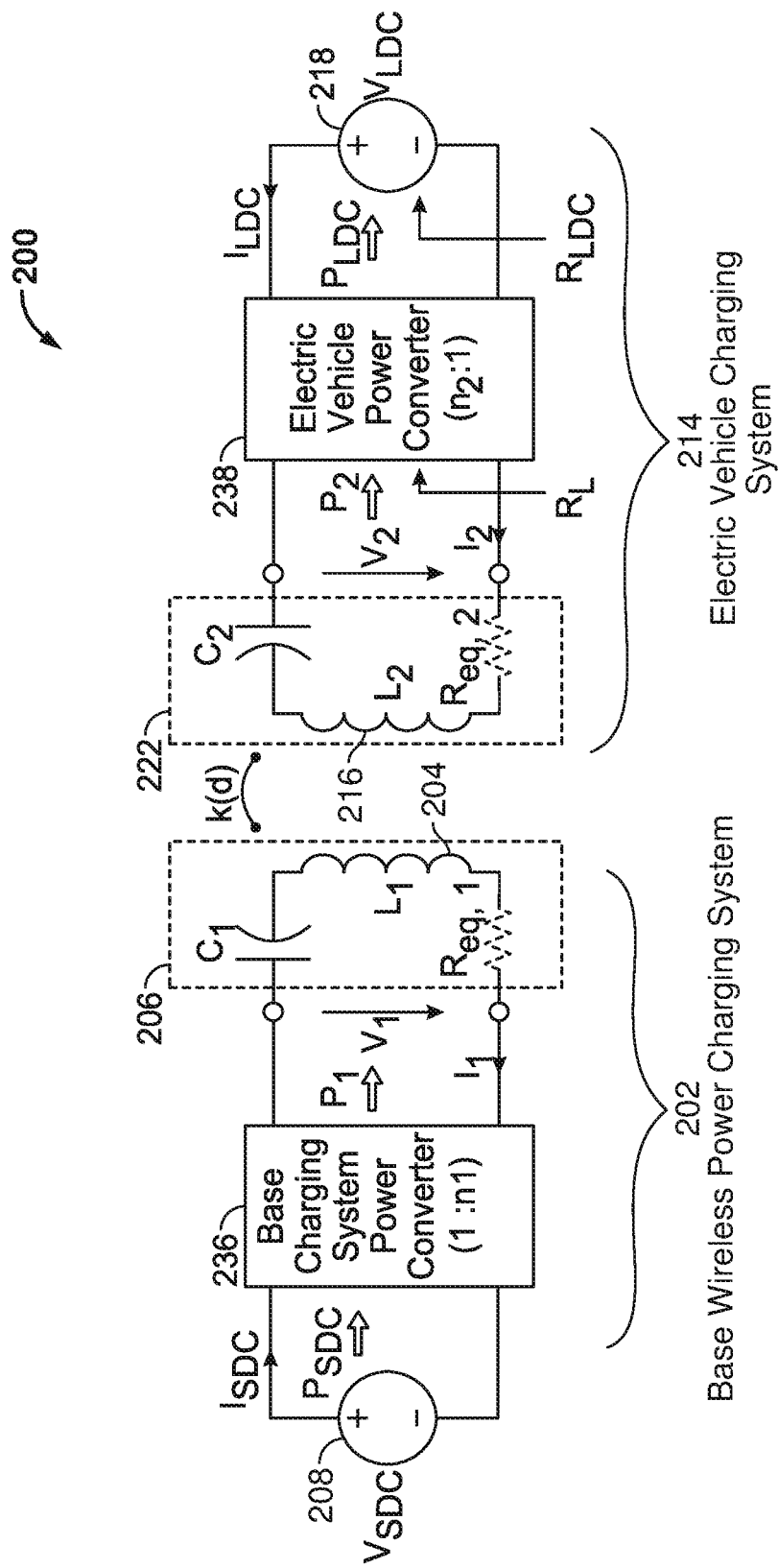
FIG. 2 is a schematic diagram of core components of the wireless power transfer system of FIG. 1.

FIG. 2 is a schematic diagram of core components of the wireless power transfer system 100 of FIG. 1. As shown in FIG. 2, the wireless power transfer system 200 may include a base system transmit circuit 206 including a base system coupler 204 having an inductance $L_1$. The wireless power transfer system 200 further includes an electric vehicle receive circuit 222 including an electric vehicle coupler 216 having an inductance $L_2$. Implementations of the couplers described herein may use capacitively loaded wire loops (i.e., multi-turn coils) forming a resonant structure that is capable of efficiently coupling energy from a primary structure (transmitter) to a secondary structure (receiver) via a magnetic or electromagnetic near field if both primary and secondary couplers (e.g., coils) are tuned to a common resonant frequency. The coils may be used for the electric vehicle coupler 216 and the base system coupler 204. Using resonant structures for coupling energy may be referred to "magnetic coupled resonance," "electromagnetic coupled resonance," and/or "resonant induction." The operation of the wireless power transfer system 200 will be described based on power transfer from a base wireless charging system 202 to an electric vehicle 112, but is not limited thereto. For example, as discussed above, the electric vehicle 112 may transfer power to the base wireless charging system 102a.

With reference to FIG. 2, a power supply 208 (e.g., AC or DC) supplies power $P_{SDC}$ to the base wireless charging system 202 to transfer energy to an electric vehicle 112. The base wireless charging system 202 includes a base charging system power converter 236. The base charging system power converter 236 may include circuitry such as an AC/DC converter configured to convert power from standard mains AC to DC power at a suitable voltage level, and a DC/low frequency (LF) converter configured to convert DC power to power at an operating frequency suitable for wireless high power transfer. The base charging system power converter 236 supplies power $P_1$ to the base system transmit circuit 206 including the capacitor $C_1$ in series with the base system coupler 204 to emit an electromagnetic field at a desired frequency. The capacitor $C_1$ may be coupled with the base system coupler 204 either in parallel or in series, or may be formed of several reactive elements in any combination of parallel or series topology. The capacitor $C_1$ may be provided to form a resonant circuit with the base system coupler 204 that resonates at a desired frequency. The base system coupler 204 receives the power $P_1$ and wirelessly transmits power at a level sufficient to charge or power the electric vehicle 112. For example, the power level provided wirelessly by the base system coupler 204 may be on the order of kilowatts (kW) (e.g., anywhere from 1 kW to 110 kW, higher, or lower).

The base system transmit circuit 206 including the base system coupler 204 and electric vehicle receive circuit 222 including the electric vehicle coupler 216 may be tuned to substantially the same frequencies and may be positioned within the near-field of an electromagnetic field transmitted by one of the base system coupler 204 and the electric vehicle coupler 116. In this case, the base system coupler 204 and electric vehicle coupler 116 may become coupled to one another such that power may be transferred to the electric vehicle receive circuit 222 including capacitor $C_2$ and electric vehicle coupler 116. The capacitor $C_2$ may be provided to form a resonant circuit with the electric vehicle coupler 216 that resonates at a desired frequency. The capacitor $C_2$ may be coupled with the electric vehicle coupler 204 either in parallel or in series, or may be formed of several reactive elements in any combination of parallel or series topology. Element k(d) represents the mutual coupling coefficient resulting at coil separation d. Equivalent resistances $R_{eq,1}$ and $R_{eq,2}$ represent the losses that may be inherent to the couplers 204 and 216 and the anti-reactance capacitors $C_1$ and $C_2$. The electric vehicle receive circuit 222 including the electric vehicle coupler 316 and capacitor $C_2$ receives power $P_2$ and provides the power $P_2$ to an electric vehicle power converter 238 of an electric vehicle charging system 214.

The electric vehicle power converter 238 may include, among other things, a LF/DC converter configured to convert power at an operating frequency back to DC power at a voltage level matched to the voltage level of an electric vehicle battery unit 218. The electric vehicle power converter 238 may provide the converted power $P_{LDC}$ to charge the electric vehicle battery unit 218. The power supply 208, base charging system power converter 236, and base system coupler 204 may be stationary and located at a variety of locations as discussed above. The battery unit 218, electric vehicle power converter 238, and electric vehicle coupler 216 may be included in an electric vehicle charging system 214 that is part of electric vehicle 112 or part of the battery pack (not shown). The electric vehicle charging system 214 may also be configured to provide power wirelessly through the electric vehicle coupler 216 to the base wireless charging system 202 to feed power back to the grid. Each of the electric vehicle coupler 216 and the base system coupler 204 may act as transmit or receive couplers based on the mode of operation.

While not shown, the wireless power transfer system 200 may include a load disconnect unit (LDU) to safely disconnect the electric vehicle battery unit 218 or the power supply 208 from the wireless power transfer system 200. For example, in case of an emergency or system failure, the LDU may be triggered to disconnect the load from the wireless power transfer system 200. The LDU may be provided in addition to a battery management system for managing charging to a battery, or it may be part of the battery management system.

Further, the electric vehicle charging system 214 may include switching circuitry (not shown) for selectively connecting and disconnecting the electric vehicle coupler 216 to the electric vehicle power converter 238. Disconnecting the electric vehicle coupler 216 may suspend charging and also may adjust the "load" as "seen" by the base wireless charging system 102a (acting as a transmitter), which may be used to "cloak" the electric vehicle charging system 114 (acting as the receiver) from the base wireless charging system 102a. The load changes may be detected if the transmitter includes the load sensing circuit. Accordingly, the transmitter, such as a base wireless charging system 202, may have a mechanism for determining when receivers, such as an electric vehicle charging system 114, are present in the near-field of the base system coupler 204.

As described above, in operation, assuming energy transfer towards the vehicle or battery, input power is provided from the power supply 208 such that the base system coupler 204 generates a field for providing the energy transfer. The electric vehicle coupler 216 couples to the radiated field and generates output power for storage or consumption by the electric vehicle 112. As described above, in some implementations, the base system coupler 204 and electric vehicle coupler 116 are configured according to a mutual resonant relationship such that when the resonant frequency of the electric vehicle coupler 116 and the resonant frequency of the base system coupler 204 are very close or substantially the same. Transmission losses between the base wireless charging system 202 and electric vehicle charging system 214 are minimal when the electric vehicle coupler 216 is located in the near-field of the base system coupler 204.

As stated, an efficient energy transfer occurs by coupling a large portion of the energy in the near field of a transmitting coupler to a receiving coupler rather than propagating most of the energy in an electromagnetic wave to the far-field. When in the near field, a coupling mode may be established between the transmit coupler and the receive coupler. The area around the couplers where this near field coupling may occur is referred to herein as a near field coupling mode region.

While not shown, the base charging system power converter 236 and the electric vehicle power converter 238 may both include an oscillator, a driver circuit such as a power amplifier, a filter, and a matching circuit for efficient coupling with the wireless power coupler. The oscillator may be configured to generate a desired frequency, which may be adjusted in response to an adjustment signal. The oscillator signal may be amplified by a power amplifier with an amplification amount responsive to control signals. The filter and matching circuit may be included to filter out harmonics or other unwanted frequencies and match the impedance of the power conversion module to the wireless power coupler. The power converters 236 and 238 may also include a rectifier and switching circuitry to generate a suitable power output to charge the battery.

The electric vehicle coupler 216 and base system coupler 204 as described throughout the disclosed implementations may be referred to or configured as "loop" antennas, and more specifically, multi-turn loop antennas. The couplers 204 and 216 may also be referred to herein or be configured as "magnetic" antennas. The term "coupler" is intended to refer to a component that may wirelessly output or receive energy for coupling to another "coupler." The coupler may also be referred to as an "antenna" of a type that is configured to wirelessly output or receive power. As used herein, couplers 204 and 216 are examples of "power transfer components" of a type that are configured to wirelessly output, wirelessly receive, and/or wirelessly relay power. Loop (e.g., multi-turn loop) antennas may be configured to include an air core or a physical core such as a ferrite core. An air core loop antenna may allow the placement of other components within the core area. Physical core antennas including ferromagnetic or ferromagnetic materials may allow development of a stronger electromagnetic field and improved coupling.

As discussed above, efficient transfer of energy between a transmitter and receiver occurs during matched or nearly matched resonance between a transmitter and a receiver. However, even when resonance between a transmitter and receiver are not matched, energy may be transferred at a lower efficiency. Transfer of energy occurs by coupling energy from the near field of the transmitting coupler to the receiving coupler residing within a region (e.g., within a predetermined frequency range of the resonant frequency, or within a predetermined distance of the near-field region) where this near field is established rather than propagating the energy from the transmitting coupler into free space.

A resonant frequency may be based on the inductance and capacitance of a transmit circuit including a coupler (e.g., the base system coupler 204) as described above. As shown in FIG. 2, inductance may generally be the inductance of the coupler (e.g., coil), whereas, capacitance may be added to the coupler to create a resonant structure at a desired resonant frequency. As a non-limiting example, as shown in FIG. 2, a capacitor may be added in series with the coupler to create a resonant circuit (e.g., the base system transmit circuit 206) that generates an electromagnetic field. Accordingly, for larger diameter couplers, the value of capacitance needed to induce resonance may decrease as the diameter or inductance of the coupler increases. Inductance may also depend on a number of turns of a coil. Furthermore, as the diameter of the coupler increases, the efficient energy transfer area of the near field may increase. Other resonant circuits are possible. As another non limiting example, a capacitor may be placed in parallel between the two terminals of the coupler (e.g., a parallel resonant circuit). Furthermore a coupler may be designed to have a high quality (Q) factor to improve the resonance and reduce losses of the coupler. For example, the native Q factor may be 300 or greater.

As described above, according to some implementations, coupling power between two couplers that are in the near field of one another is disclosed. As described above, the near field may correspond to a region around the coupler in which electromagnetic fields exist but may not propagate or radiate away from the coupler. Near-field coupling-mode regions may correspond to a volume that is near the physical volume of the coupler, typically within a small fraction of the wavelength. According to some implementations, electromagnetic couplers, such as single and multi-turn loop antennas, are used for both transmitting and receiving since magnetic near field amplitudes in practical implementations tend to be higher for magnetic type coils in comparison to the electric near fields of an electric type antenna (e.g., a small dipole). This allows for potentially higher coupling between the pair. Furthermore, "electric" antennas (e.g., dipoles and monopoles) or a combination of magnetic and electric antennas may be used.

Figure 3:
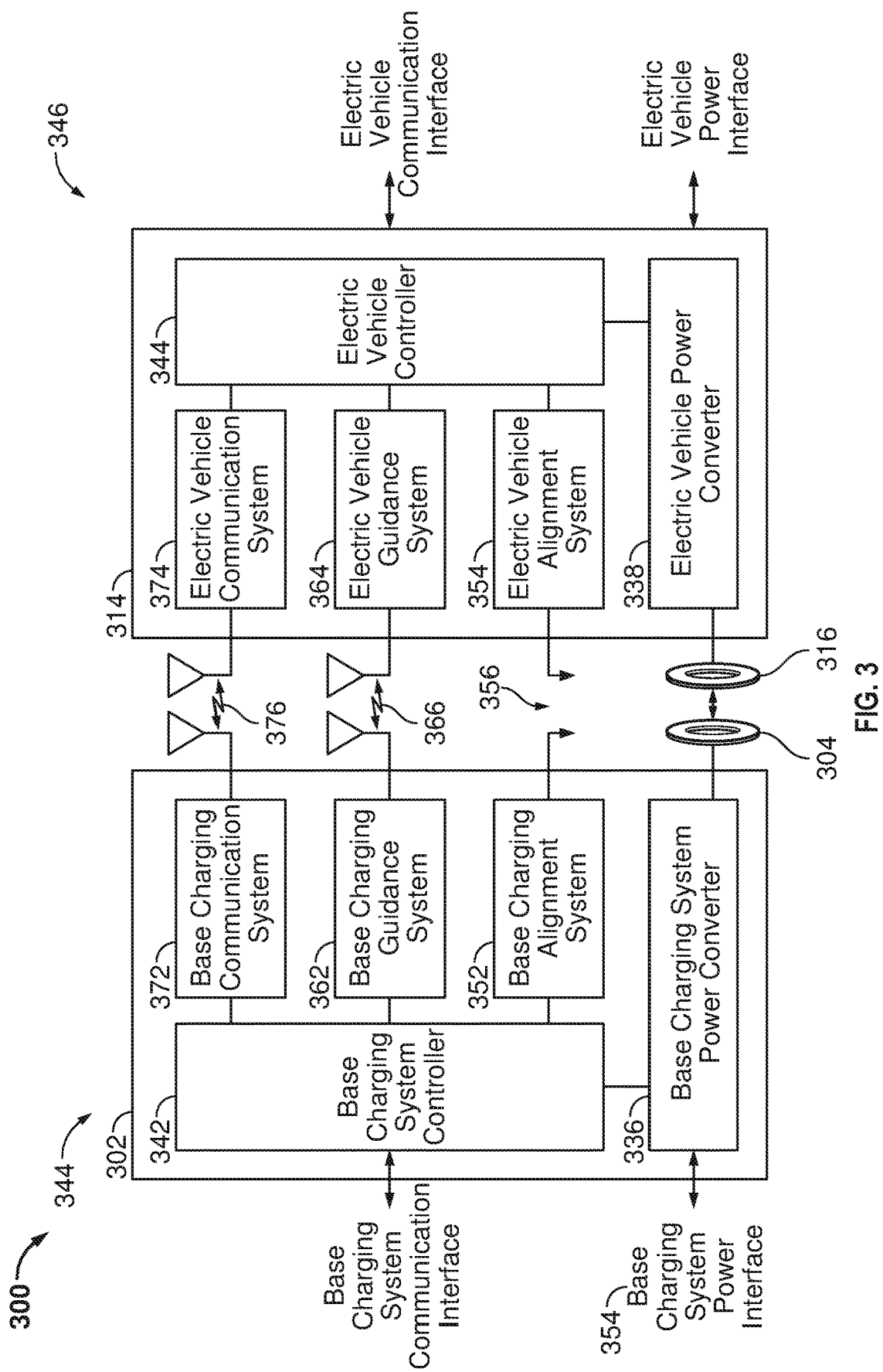
FIG. 3 is another functional block diagram showing core and ancillary components of the wireless power transfer system of FIG. 1.

FIG. 3 is another functional block diagram showing core and ancillary components of the wireless power transfer system 100 of FIG. 1 and/or that wireless power transfer system 200 of FIG. 2 may be part of. The wireless power transfer system 300 illustrates a communication link 376, a guidance link 366, and alignment mechanism 356 capable of mechanically moving one or both of the base system coupler 304 and electric vehicle coupler 316 via base alignment system 352 and electric vehicle alignment systems 354. The guidance link 366 may be capable of bi-directional signaling, meaning that guidance signals may be emitted by the base guidance system 362 or the electric vehicle guidance system 364 or by both. As described above with reference to FIG. 2, and assuming energy flow towards the electric vehicle 112, in FIG. 3 a base charging system power interface 348 may be configured to provide power to a charging system power converter 336 from a power source, such as an AC or DC power supply 126. The base charging system power converter 336 may receive AC or DC power from the base charging system power interface 348 to excite the base system coupler 304 at or near its resonant frequency. The electric vehicle coupler 316, when in the near field coupling-mode region, may receive energy from the near field coupling mode region to oscillate at or near the resonant frequency. The electric vehicle power converter 338 converts the oscillating signal from the electric vehicle coupler 316 to a power signal suitable for charging a battery via the electric vehicle power interface.

The base wireless charging system 302 includes a base charging system controller 342 and the electric vehicle charging system 314 includes an electric vehicle controller 344. The base charging system controller 342 may include a base charging system communication interface 358 to other systems (not shown) such as, for example, a computer, and a power distribution center, or a smart power grid. The electric vehicle controller 344 may include an electric vehicle communication interface to other systems (not shown) such as, for example, an on-board computer on the vehicle, other battery charging controller, other electronic systems within the vehicles, and remote electronic systems.

The base charging system controller 342 and electric vehicle controller 344 may include subsystems or modules for specific application with separate communication channels. These communications channels may be separate physical channels or separate logical channels. As non-limiting examples, a base charging alignment system 352 may communicate with an electric vehicle alignment system 354 through a communication link 376 to provide a feedback mechanism for more closely aligning the base system coupler 304 and electric vehicle coupler 316, either via autonomous, mechanical (kinematic) alignment or with operator assistance. Similarly, a base charging guidance system 362 may communicate with an electric vehicle guidance system 364 through a guidance link 366 to provide a feedback mechanism to guide an operator in aligning the base system coupler 304 and electric vehicle coupler 316. In addition, there may be separate general-purpose communication links (e.g., channels) supported by base charging communication system 372 and electric vehicle communication system 374 for communicating other information between the base wireless charging system 302 and the electric vehicle charging system 314. This information may include information about electric vehicle characteristics, battery characteristics, charging status, and power capabilities of both the base wireless charging system 302 and the electric vehicle charging system 314, as well as maintenance and diagnostic data for the electric vehicle 112. These communication channels may be separate physical communication channels such as, for example, Bluetooth, zigbee, cellular, etc.

Electric vehicle controller 344 may also include a battery management system (BMS) (not shown) that manages charge and discharge of the electric vehicle principal battery, a parking assistance system based on microwave or ultrasonic radar principles, a brake system configured to perform a semi-automatic parking operation, and a steering wheel servo system configured to assist with a largely automated parking 'park by wire' that may provide higher parking accuracy, thus reducing the need for mechanical horizontal coupler alignment in any of the base wireless charging system 102a and the electric vehicle charging system 114. Further, electric vehicle controller 344 may be configured to communicate with electronics of the electric vehicle 112. For example, electric vehicle controller 344 may be configured to communicate with visual output devices (e.g., a dashboard display), acoustic/audio output devices (e.g., buzzer, speakers), mechanical input devices (e.g., keyboard, touch screen, and pointing devices such as joystick, trackball, etc.), and audio input devices (e.g., microphone with electronic voice recognition).

Furthermore, the wireless power transfer system 300 may include detection and sensor systems. For example, the wireless power transfer system 300 may include sensors for use with systems to properly guide the driver or the vehicle to the charging spot, sensors to mutually align the couplers with the required separation/coupling, sensors to detect objects that may obstruct the electric vehicle coupler 316 from moving to a particular height and/or position to achieve coupling, and safety sensors for use with systems to perform a reliable, damage free, and safe operation of the system. For example, a safety sensor may include a sensor for detection of presence of animals or children approaching the wireless power couplers 104a, 116 beyond a safety radius, detection of objects near the base system coupler 304 that may be heated up (induction heating), detection of hazardous events such as incandescent objects on the base system coupler 304, and temperature monitoring of the base wireless charging system 302 and electric vehicle charging system 314 components.

The wireless power transfer system 300 may also support plug-in charging via a wired connection. A wired charge port may integrate the outputs of the two different chargers prior to transferring power to or from the electric vehicle 112. Switching circuits may provide the functionality as needed to support both wireless charging and charging via a wired charge port.

To communicate between a base wireless charging system 302 and an electric vehicle charging system 314, the wireless power transfer system 300 may use both in-band signaling and/or out-of-band signaling. Out-of-band communication may be carried out using an RF data modem (e.g., Ethernet over radio in an unlicensed band). The out-of-band communication may provide sufficient bandwidth for the allocation of value-add services to the vehicle user/owner. A low depth amplitude or phase modulation of the wireless power carrier may serve as an in-band signaling system with minimal interference.

In addition, some communication may be performed via the wireless power link without using specific communications antennas. For example, the wireless power couplers 304 and 316 may also be configured to act as wireless communication transmitters. Thus, some implementations of the base wireless charging system 302 may include a controller (not shown) for enabling keying type protocol on the wireless power path. By keying the transmit power level (amplitude shift keying) at predefined intervals with a predefined protocol, the receiver may detect a serial communication from the transmitter. The base charging system power converter 336 may include a load sensing circuit (not shown) for detecting the presence or absence of active electric vehicle receivers in the vicinity of the near field generated by the base system coupler 304. By way of example, a load sensing circuit monitors the current flowing to the power amplifier, which is affected by the presence or absence of active receivers in the vicinity of the near field generated by base system coupler 104a. Detection of changes to the loading on the power amplifier may be monitored by the base charging system controller 342 for use in determining whether to enable the oscillator for transmitting energy, to communicate with an active receiver, or a combination thereof.

To enable wireless high power transfer, some implementations may be configured to transfer power at a frequency in the range from 20-150 kHz. This low operating frequency may allow highly efficient power conversion that may be achieved using solid state devices. In addition, there may be less coexistence issues with radio systems compared to other bands.

With respect to induction charging, depending on the energy transfer rate (power level), operating frequency, size and design of the primary and secondary magnetic structures and the distance between them, the flux density in the air gap at some locations may exceed 0.5 mT and may reach several Millitesla. If an object that includes a certain amount of conductive material (e.g., such as metal) is inserted into the space between the primary and secondary structures, eddy currents are generated in this object (Faraday's and Lenz's law), that may lead to power dissipation and subsequent heating effects. This induction heating effect depends on the magnetic flux density, the frequency of the time-varying magnetic field (e.g., an alternating magnetic field), and the size, shape, orientation and conductivity of the object's conducting structure. When the object is exposed to the magnetic field for a sufficiently long time, it may heat up to temperatures that may be considered hazardous in several regards. One hazard may be self-ignition if the object includes inflammable materials or if it is in direct contact with such materials, e.g., a cigarette package including a thin metallic foil or metallic film. Another hazard may be burning the hand of a person that may pick-up such a hot object, e.g., a coin or a key. Another hazard may be damaging the plastic enclosure of the primary or secondary structure, e.g., an object melting into the plastic.

A temperature increase may be also expected in objects including ferromagnetic materials that may be substantially non-conducting but exhibiting a pronounced hysteresis effect or in materials that generate both hysteresis and eddy current losses. As such, detecting such objects is beneficial to avoid corresponding harmful consequences. If the object detection system is integrated within a system for providing wireless power, in response to detecting a harmful object, the system may reduce a power level or shut down until measures may be taken to remove the harmful object. Sensing objects based on their changing temperature inductively may be called "inductive thermal sensing."

In certain applications of inductive power transfer such as charging of electric vehicles in domestic and public zones, it may be compulsory for reasons of safety of persons and equipment to be able to detect foreign objects that have the potential to heat up to critical temperatures. This may be particularly true in systems where the critical space is open and accessible such that foreign objects may get accidentally or intentionally placed in this space (e.g., in case of sabotage).

Implementations described herein are directed to automatically detecting hazardous ferromagnetic foreign objects (e.g., metal objects including ferromagnetic materials) that may be located in a predetermined space. In particular, certain implementations are directed to detecting small metal objects (e.g., a coin) located adjacent to a surface of the primary or secondary magnetic structure where magnetic flux density may exceed a particular value (e.g., 0.5 mT).

The methods and concepts disclosed herein enable inductive detection of objects of another category of foreign metallic objects that change some electromagnetic properties or electrical characteristics instantaneously upon exposing the object to a biasing magnetic field. Such magnetic biasing effects can be observed in ferromagnetic materials e.g. iron, steel but also in ferrites (e.g. soft ferrites).

Metallic objects containing ferromagnetic materials are a potential hazard as they may heat up to critical temperatures when exposed to an alternating magnetic field at a level that is typically produced inside the functional space of an Inductive Power Transfer (IPT) system. This may be particularly true for lengthy objects if oriented with their long side (easy axis of magnetization) in the direction of the IPT magnetic field. Detecting ferromagnetic metallic objects is therefore of particular importance. Many objects used in daily life such as tools, screws, nuts, washers, nails, paper clips, etc. belong to this category. Some objects of this category may also fall into the category of objects that heat up rapidly and whose electrical conductivity and/or magnetic permeability also change substantially as the object's temperature increases or decreases.

Most of the means and functions used for ordinary inductive sensing of metallic (electrically conductive) objects may also apply to the methods and concepts disclosed herein for the detection of ferromagnetic metallic objects. Therefore, these methods and concepts should be construed as another additive feature of an enhanced metal object detection apparatus, not necessarily requiring a separate, additional apparatus.

Sensors and other parts of the foreign object detection systems disclosed herein are conceived to be integrated into an IPT coupler (IPT pad) and, in particular, into the IPT base coupler (base pad). However, the principal methods and concepts disclosed herein may also apply to a vehicle coupler (vehicle pad) integration and also to non-integrated stand-alone (discrete) solutions. The IPT coupler may be one of a so-called "circular"-type coupler (using a "circular" coil), a "Double D"-type coupler (using a double coil arrangement), a "Solenoid"-type coupler (using a solenoid coil wound around a core), a "Bi-polar"-type coupler (using a double coil arrangement with virtually zero coupling between coils) or any other type of coupler based on a single or multi-coil arrangement. An IPT coupler may be composed of a planar coil structure (e.g. made of a Copper Litz wire), a planar ferrite structure (e.g. soft ferrite material) backing the coil, and a conductive back plate (e.g. made of aluminum) disposed on a surface of the planar ferrite structure opposite to the surface of the coil.

Descriptions and drawings herein assume a single ferromagnetic foreign object for the sake of simplicity. However, methods and apparatuses disclosed herein generally have the potential to detect an abnormal state due to the presence of more than one ferromagnetic foreign object within a predetermined space.

Electrically conductive and ferromagnetic objects exposed to a low frequency alternating magnetic field, e.g. an IPT magnetic field in the range from 20 to 150 kHz with a flux density in the order of 1 mT or above, may heat up to hazardous temperatures, e.g., above 500 K. This is particularly true for lengthy ferromagnetic objects if their longer axis is substantially oriented in a direction of the magnetic field. Objects with temperatures greater than 500 K may be considered a potential risk for fire if the object comes in contact with a flammable material such as paper, dry foliage, oil, fuel, etc. Therefore, such objects must be considered a safety issue for an IPT system generating magnetic flux density levels in the Millitesla (mT) range in its functional space, if open and accessible. If laying directly on the surface of a base pad, such hot objects may also cause damage since they could melt or burn the plastic enclosure.

The presence of a ferromagnetic (e.g., metallic) object in a predetermined space can be detected inductively by measuring at least one electrical characteristic (e.g., an equivalent inductance, an equivalent resistance, a frequency response, or an impulse response) at the terminals of at least one loop of an electrical conductor, herein called an inductive sense coil. A ferromagnetic object of sufficient size that is sufficiently close to an inductive sense coil will alter the sensing magnetic field as generated by that inductive sense coil so as to exert a measurable impact on one or more of the above-mentioned electrical characteristics. Furthermore, in some implementations, a ferromagnetic object may be detected by comparing a measured sample of at least one of the above-mentioned electrical characteristics with a reference sample of that same at least one characteristic. Such a reference sample may have been obtained in a process of calibration in absence of any ferromagnetic foreign object, for example.

However, for increased detection sensitivity requirements, and in certain use cases, this basic approach may not provide a reliable foreign object detection solution. For example, if other metallic or magnetic structures are located in the sensing range of the foreign object detection system and are not stationary, the structures' effects on the characteristics of the inductive sense coil will also dynamically change. Thus, a simple calibration process cannot nullify the effects of such other metallic structures. In a ground-to-vehicle inductive charging application with a foreign object detection integrated into the base pad, such a disturbing structure may include the vehicle IPT coupler and/or the vehicle's underbody. In addition, electrically conductive or magnetic structures in the base pad may also exert a variable measurable effect on one the characteristics of one or more inductive sense coils. Such effects may be due to, e.g., small movements caused by mechanical stress, varying temperature, and/or changes in the electrical and/or magnetic properties of these structures as a consequence of a changing temperature or magnetic field, for example. Moreover, electrical characteristics of such an inductive sense coil itself may change due to mechanical stress, temperature effects, or changes in the electric properties of the surrounding insulating materials, resulting in a change of the inductive sense coil's self-capacitance or ground capacitance. The effects of a changing environment may be manageable in a system designed for detecting metallic objects located near a surface (essentially in a two-dimensional space), but they may become a major challenge in a foreign object detection system designed for increased sensitivity, e.g., for detecting metal objects in an extended (three-dimensional) space.

Ferromagnetic metallic (e.g., conductive) objects can potentially be detected inductively, e.g., in the MHz frequency range, through an instantaneous change of one or more characteristics (e.g., equivalent inductance and/or equivalent resistance) of an inductive sense coil that occurs when exposed to a strong enough static biasing magnetic field. It appears that the electrical conductivity, and generally also the magnetic permeability, of a ferromagnetic object instantaneously changes when exposed to the biasing static magnetic field. The biasing static magnetic field may be considered to exert a biasing effect on the electromagnetic material properties of the ferromagnetic object. This effect is typically relatively weak for most ferromagnetic metallic objects that are subjected to a static biasing magnetic field. This relatively weak effect can be explained by a known magneto-impedance effect of ferromagnetic objects.

However, the impact on an equivalent inductance or an equivalent resistance of the inductive sense coil is several orders of magnitude larger (e.g., 100 to 1000 times larger) than what could be explained by the above-described magneto-impedance effect when the ferromagnetic object is exposed to a biasing low-frequency time-varying magnetic field (e.g., alternating magnetic field). This comparatively strong effect cannot be explained by the ordinary magneto-impedance effect, as may apply to static biasing magnetic fields. For some implementations of IPT, a biasing alternating magnetic field may be the low-frequency alternating magnetic field as generated for power transfer, thus eliminating the need for an auxiliary biasing alternating magnetic field. In other implementations, the biasing alternating magnetic field may be a different alternating magnetic field from that used for power transfer.

Exposing ferromagnetic objects to the IPT magnetic field generally modulates the object's apparent electrical conductivity and magnetic permeability, which may, in turn, result in a modulation of the equivalent resistance and/or equivalent inductance as measured at the terminals of the inductive sense coil at sense frequencies. Depending on the impact of the ferromagnetic object on the equivalent inductance and/or resistance of the sense coil, this low frequency modulation may be of a very small degree, e.g., less than 1%.

In some implementations, the modulating effect on the apparent conductivity and permeability of the ferromagnetic object may also be accompanied by a Joule heating effect due to eddy current and/or hysteresis losses within the skin depth of the ferromagnetic object caused by the biasing alternating magnetic field. The Joule heating effect will increase the temperature of the ferromagnetic object and will consequently also alter the apparent electrical conductivity and magnetic permeability of the ferromagnetic object, depending on the temperature coefficient of the ferromagnetic object.

Figure 4:
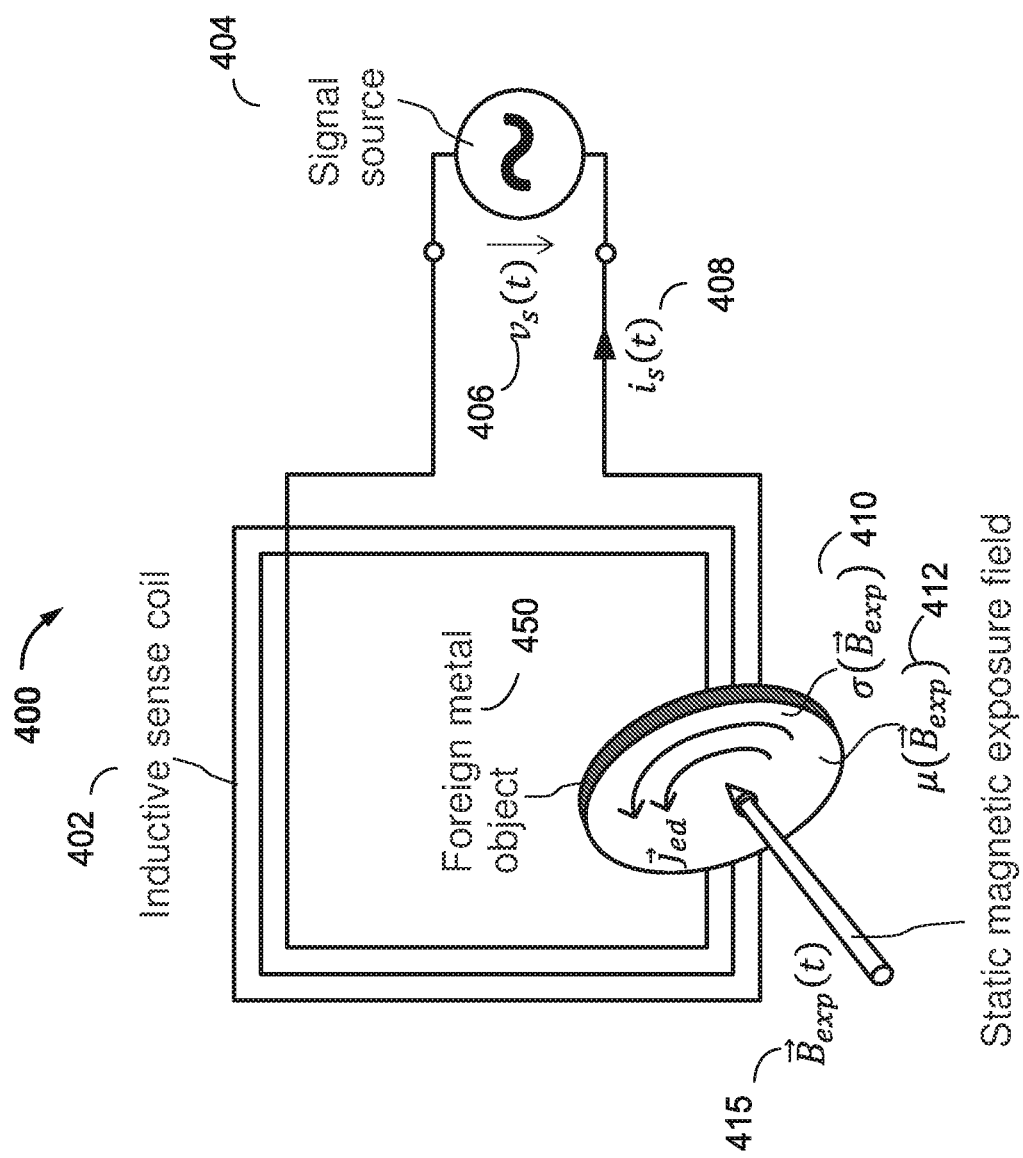
FIG. 4 is a diagram of a simplified circuit for detecting a ferromagnetic foreign object using an inductive sense coil where the object's electrical conductivity and magnetic permeability are a function of exposure to a biasing static magnetic field, in accordance with some implementations.

FIG. 4 is a diagram of a simplified circuit 400 for detecting a ferromagnetic foreign object (e.g., foreign object 450) using an inductive sense coil 402 where the object's electrical conductivity and magnetic permeability are a function of exposure to a biasing static magnetic field 415, in accordance with some implementations. The circuit 400 includes the inductive sense coil 402, which may comprise a coil of one or more loops and a foreign object 450 exposed to a static magnetic field $\vec{B}_{exp}(t)$ 415. The inductive sense coil 402 may be excited by a sinusoidal signal source 404 at a voltage $v_s(t)$ 406 and a sense frequency ($f_s$) resulting in a sense current $i_s(t)$ 408. The static magnetic field $\vec{B}_{exp}(t)$ 415 magnetically biases the foreign object 450. The foreign object's 450 electrical conductivity $\sigma(\vec{B}_{exp})$ 410 and magnetic permeability $\mu(\vec{B}_{exp})$ 412 as apparent through inductive sensing are generally functions of the biasing static magnetic field $\vec{B}_{exp}$. Since equivalent inductance and resistance are functions of $\sigma(\vec{B}_{exp})$ and $\mu(\vec{B}_{exp})$, a presence of the foreign object 450 can be potentially detected by analyzing current $i_s(t)$ in relation to source voltage $v_s(t)$ 515 and the strength of the static magnetic field $\vec{B}_{exp}$.

Figure 5:
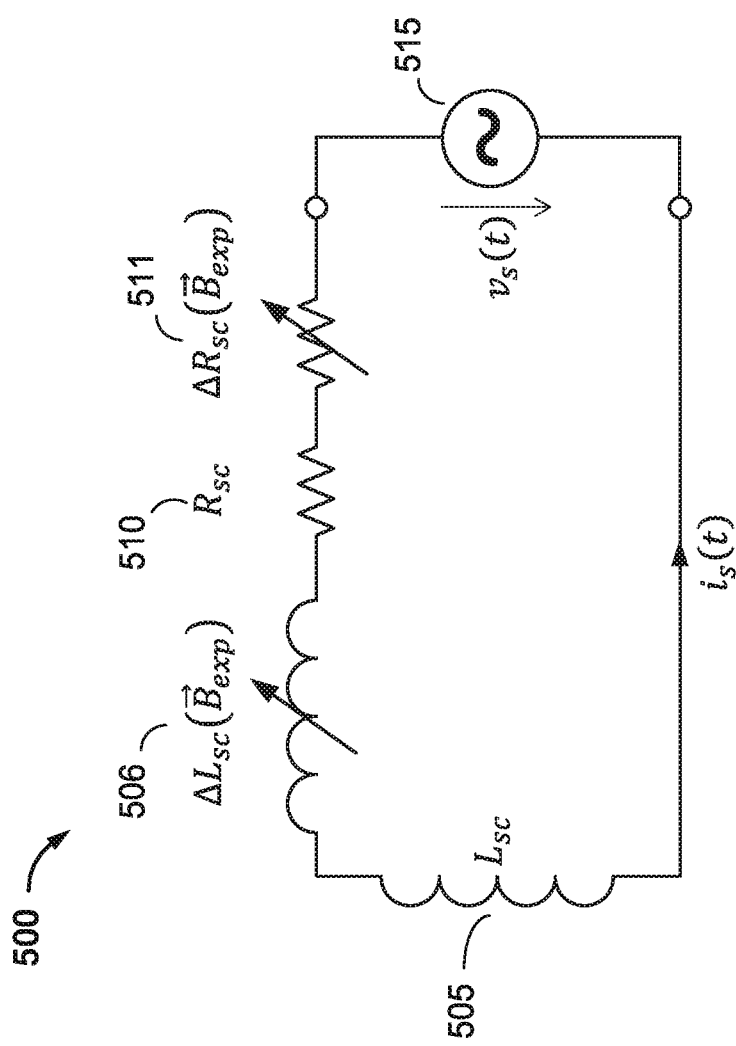
FIG. 5 is an equivalent circuit diagram of the simplified circuit for detecting the ferromagnetic foreign object of FIG. 4.

FIG. 5 is an equivalent circuit diagram 500 of the simplified circuit 400 for detecting the foreign object 450 of FIG. 4. The equivalent series circuit 500 may be applicable to a steady state of a sinusoidal excitation of an inductive sense coil (e.g., sense coil 402 of FIG. 4) by a voltage $v_s(t)$ having frequency $f_s$, which induces a current $i_s(t)$ to circulate in the circuit 500. The equivalent series circuit 500 comprises a series inductance $L_{sc}$ 505 representing the system's overall energy storage effect and a series resistance $R_{sc}$ 510 representing the system's overall loss effects. The equivalent series circuit 500 also comprises differential inductance $\Delta L_{sc}(\vec{B}_{exp})$ 506 and differential resistance $\Delta R_{sc}(\vec{B}_{exp})$ 511, which represent the inductive and resistive effects, respectively, exerted by a ferromagnetic object (e.g., the foreign object 450 of FIG. 4) in the influence zone of the inductive sense coil (e.g., the inductive sense coil 402 of FIG. 4). Differential inductance $\Delta L_{sc}(\vec{B}_{exp})$ 506 and differential resistance $\Delta R_{sc}(\vec{B}_{exp})$ 511 of the foreign object 450 are affected instantaneously when the object is exposed to the biasing static magnetic field $\vec{B}_{exp}$.

Figure 6:
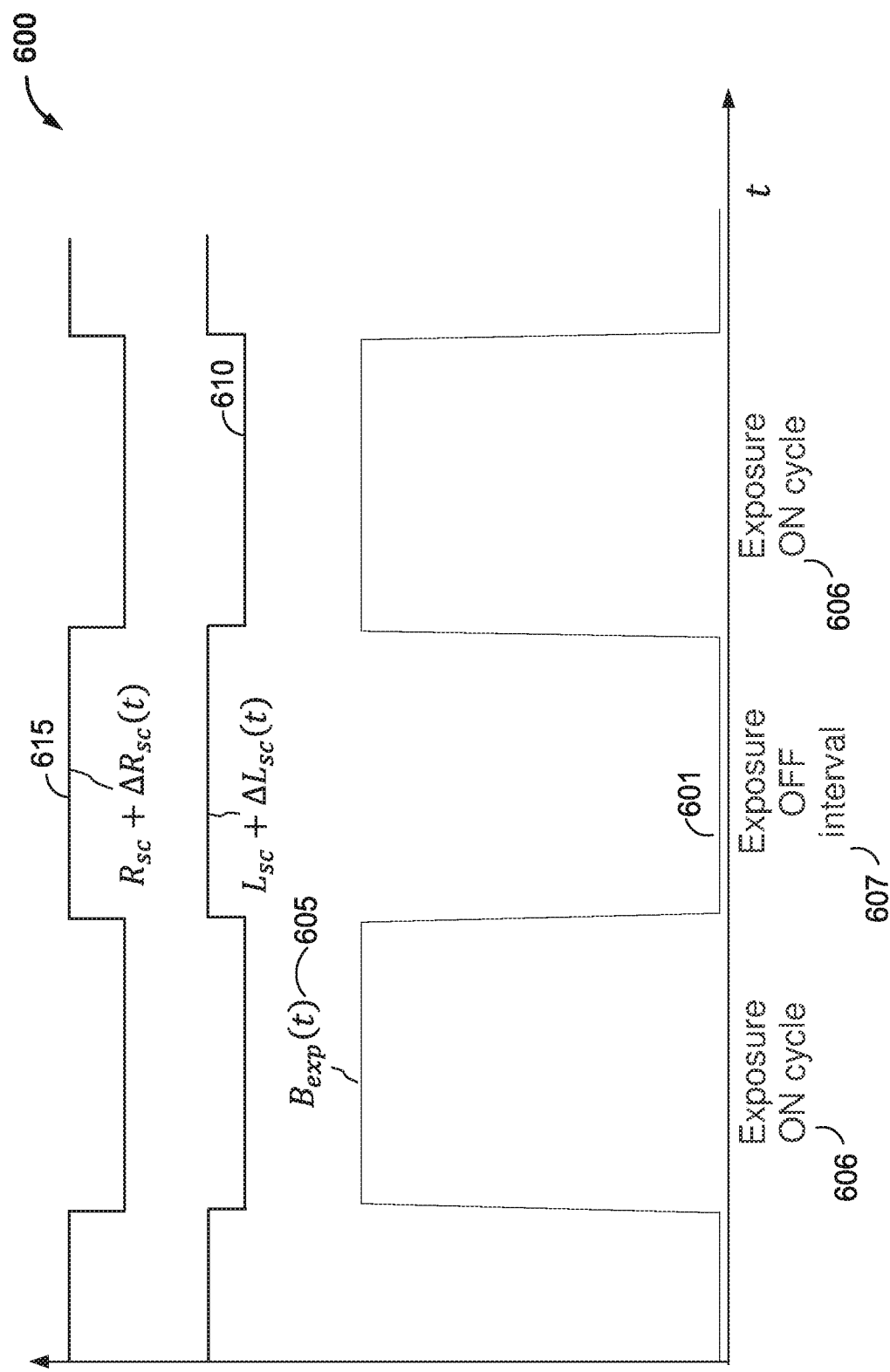
FIG. 6 is a time diagram illustrating an effect of intermittent exposure of a ferromagnetic foreign object to a static magnetic field on characteristics of an inductive sense coil, in accordance with some implementations.

FIG. 6 is a time diagram 600 illustrating an effect of intermittent exposure of a ferromagnetic foreign object to a static magnetic field $\vec{B}_{exp}$ on characteristics of the inductive sense coil (e.g., the inductive sense coil 402 of FIG. 4), in accordance with some implementations. As shown in FIG. 6, a foreign object (e.g., foreign object 450 of FIG. 4) is intermittently exposed to the static biasing magnetic field $\vec{B}_{exp}$. The detection method is based on "stimulated" inductive impedance and resistance sensing where at a minimum, stimulation may comprise at least one exposure ON interval 606 followed by an exposure OFF interval 607. FIG. 6 shows this toggling of the static magnetic field $\vec{B}_{exp}$ according to line 601. FIG. 6 additionally shows the resulting time variations of sense coil's equivalent inductance $L_{sc}+\Delta L_{sc}(t)$ 610 and equivalent resistance $R_{sc}+\Delta R_{sc}(t)$ 615. As shown, and according to the known magneto-impedance effect, both the equivalent inductance $L_{sc}+\Delta L_{sc}(t)$ 610 and the equivalent resistance $R_{sc}+\Delta R_{sc}(t)$ 615 decrease during the exposure ON intervals 606 and increase during the exposure OFF interval 607. These characteristic variations may reveal the presence of a ferromagnetic foreign object.

For example, in an implementation, at least one of an inductive sense coil 402's characteristics e.g., an equivalent resistance $R_{sc}+\Delta R_{sc}(t)$ 615, is measured constantly and recorded over a time period of at least a fraction of an exposure interval (e.g., ON interval 606 and OFF interval 607) including the start. To determine a presence of a foreign object 450, in some implementations, the at least one recorded time course of resistance $R_{sc}+\Delta R_{sc}(t)$ 615 is compared with the exposure time profile 601 for $\overline{B_{exp}}(t)$ 605. In some other implementations, this comparison is a correlation. The recorded time course of resistance $R_{sc}+\Delta R_{sc}(t)$ 615 or other sense coil 402 characteristic is correlated with the exposure time profile 601 for $\overline{B_{exp}}(t)$ 605. In a further implementation, correlation is performed with at least one of a time-derivative, e.g., the first derivative d/dt (the time gradient) of the recorded time course of at least one of an inductive sense coil 402's characteristics.

Figure 7:
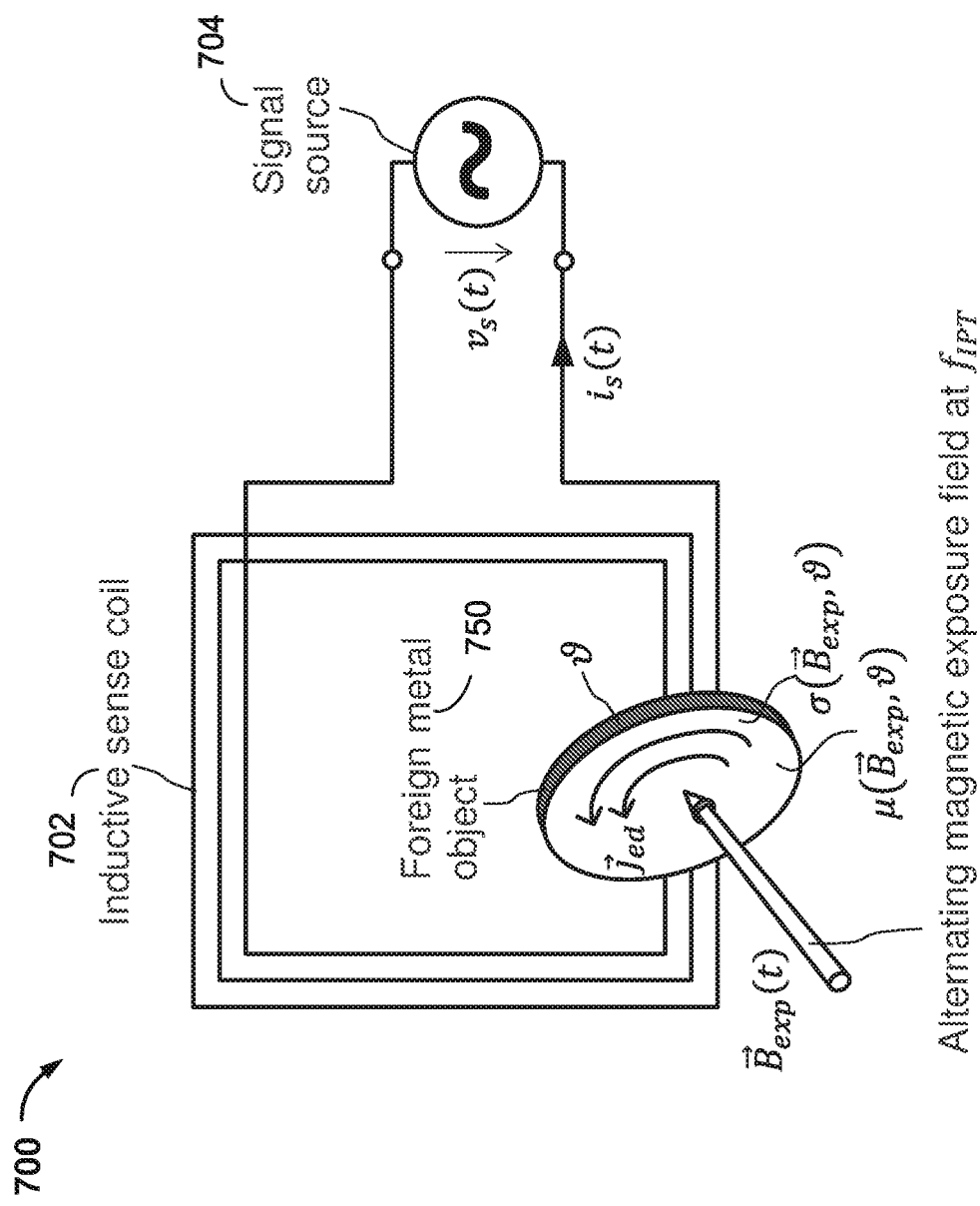
FIG. 7 is a diagram of a simplified circuit for detecting a ferromagnetic foreign object using an inductive sense coil where the object's electrical conductivity and magnetic permeability are a function of exposure to a biasing alternating magnetic field, in accordance with some implementations.

FIG. 7 is a diagram of a simplified circuit 700 for detecting a ferromagnetic foreign object (e.g., foreign object 750) using an inductive sense coil 702 where the object's electrical conductivity $\sigma(B_{exp}, \vartheta)$ and magnetic permeability $\mu(\vec{B}_{exp}, \vartheta)$, are a function of exposure to a biasing time-varying magnetic field $\vec{B}_{exp}(t)$, in accordance with some implementations. In some implementations, the biasing time-varying (e.g., alternating) magnetic field $\vec{B}_{exp}(t)$ may be the IPT low frequency magnetic field. In such cases, means for generating a second time-varying magnetic field may comprise one or more IPT transmit coils. The alternating magnetic field $\vec{B}_{exp}(t)$ may alternate with a frequency $f_{IPT}$. As with the static magnetic field previously described in connection with FIG. 4, the foreign object's 750 apparent electrical conductivity $\sigma(\vec{B}_{exp}, \vartheta)$ and magnetic permeability $\mu(\vec{B}_{exp}, \vartheta)$ vary in some relationship to the alternating exposure field $\vec{B}_{exp}(t)$, so as to modulate current $i_s(t)$, which is driven by the voltage $v_s(t)$ provided by the voltage source 704. However, as the notation shows, $\sigma(\vec{B}_{exp}, \vartheta)$ and $\mu(\vec{B}_{exp}, \vartheta)$ are normally also functions of the object's temperature $\vartheta$, and are thus also indirectly affected by the biasing alternating magnetic field $\vec{B}_{exp}(t)$ via the Joule heating effect. However, testing with many different objects has shown that this Joule heating effect is generally much weaker than the modulating effect due to exposure to the biasing alternating magnetic field, and changes due to the Joule heating effects are also orders of magnitude slower than the nearly instantaneous changes due to this novel modulating effect, depending on the thermal capacity of the foreign object 750 and the heating power. The presence of the foreign object 750 can potentially be detected by analyzing the current $i_s(t)$ in relation to source voltage $v_s(t)$ and to the exposure field signal $\vec{B}_{exp}(t)$ by this modulating effect and, in some cases, also by the thermal effect.

Figure 8:
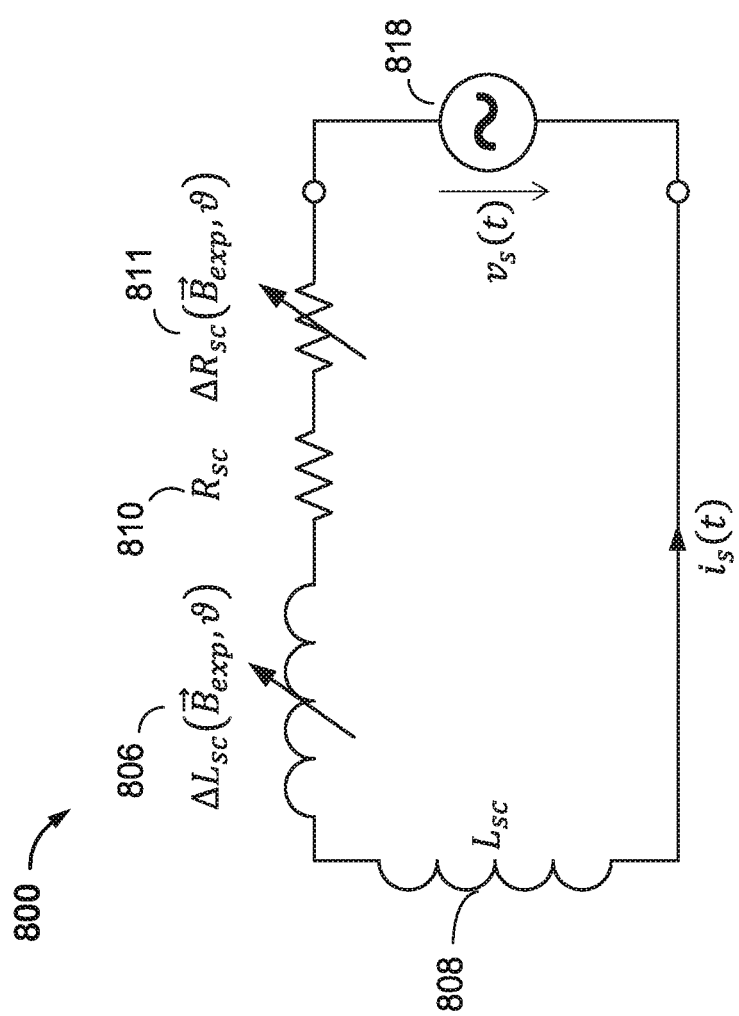
FIG. 8 is an equivalent circuit diagram of the simplified circuit for detecting the ferromagnetic foreign object of FIG. 7.

FIG. 8 is an equivalent circuit 800 diagram of the simplified circuit 700 for detecting the foreign object 750 of FIG. 7. The equivalent circuit 800 of FIG. 8 comprises a voltage source 818 providing a voltage $v_s(t)$, which drives a current $i_s(t)$ through a series connection of an equivalent inductance $L_{sc}$ 808, an equivalent series resistance $R_{sc}$ 810, and the portions of the equivalent inductance $\Delta L_{sc}(\vec{B}_{exp}, \vartheta)$ 806 and of the equivalent resistance $\Delta R_{sc}(\vec{B}_{exp}, \vartheta)$ 811 that can be attributed to the presence of the foreign object 750 and that are generally affected by both the modulating and the thermal effects when exposed to the alternating magnetic field $\vec{B}_{exp}(t)$.

Figure 9:
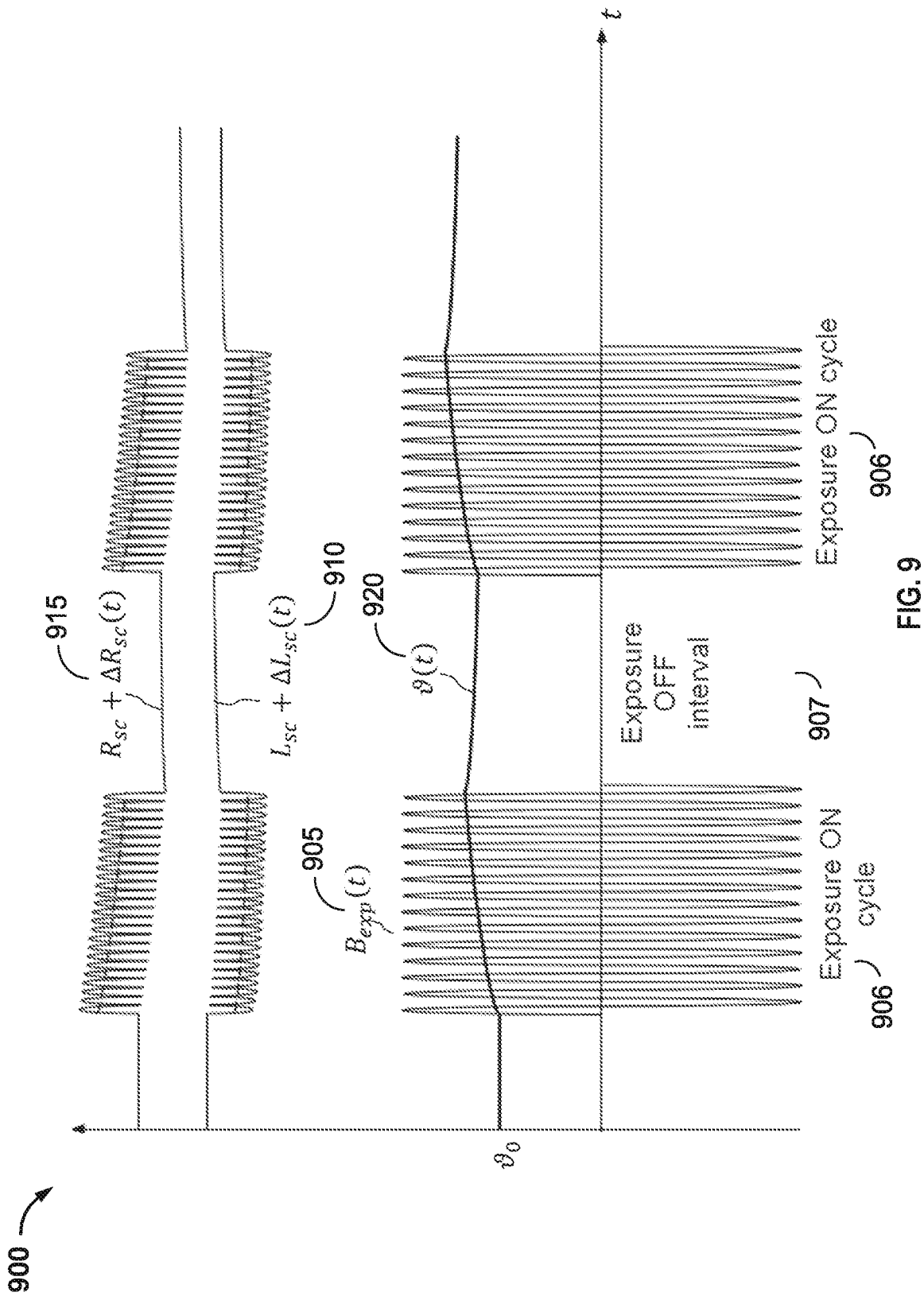
FIG. 9 is a time diagram illustrating an effect of intermittent exposure of a ferromagnetic foreign object to a biasing and heating alternating magnetic field on characteristics of an inductive sense coil, in accordance with some implementations.

FIG. 9 is a time diagram 900 illustrating an effect of intermittent exposure of a ferromagnetic foreign object to a biasing and heating alternating magnetic field $\vec{B}_{exp}$ on characteristics of an inductive sense coil, in accordance with some implementations. A first time course 915 shows the inductive sense coil's 702 equivalent resistance $R_{sc}+R_{sc}(t)$ and a second time course 910 shows the inductive sense coil's 702 equivalent inductance $L_{sc}+\Delta L_{sc}(t)$. A third time course 905 shows the alternating magnetic field $\vec{B}_{exp}(t)$ having ON intervals 906 separated by an OFF interval 907, while a fourth time course 920 shows the temperature $\vartheta(t)$ of the foreign object 750, having initial temperature $\vartheta_0$. In the presence of the foreign object 750, the equivalent resistance and the equivalent inductance are periodically varying with a frequency (modulating frequency) that is double that of the frequency $f_{IPT}$ of the alternating magnetic field $\vec{B}_{exp}(t)$. This frequency doubling effect indicates that this modulation of electromagnetic material properties is independent of the sign of the alternating magnetic field $\vec{B}_{exp}(t)$, and thus provides a rectifying effect. In addition, the short term average of the equivalent resistance, shown as the sloped dotted line, instantaneously increases when the alternating magnetic field $\vec{B}_{exp}(t)$ is turned ON. This is an opposite effect from that previously described with respect to the ordinary magneto-impedance effect in FIG. 6, where the equivalent resistance decreases with exposure to the static magnetic field. In addition, the temperature effect can be seen by the slight slope of this short term average of the equivalent resistance and of the short term average of the equivalent inductance 910, which follow the temperature time course 920 of the foreign object 750 resulting from the Joule heating effect.

For a sensing system using the sinusoidal sense voltage $v_s(t)$, this modulation effect can be generally observed in the time domain as an amplitude and phase modulation of the resulting current $i_s(t)$ (see FIGS. 7 and 8). For some ferromagnetic objects (e.g. paper clips) this modulation effect may be highly non-linear, manifesting in a periodic sequence of short pulses, however, always with a fundamental frequency that is twice that of the frequency $f_{IPT}$ of the alternating magnetic field $\vec{B}_{exp}(t)$. The degree of modulation depends on the impact of the foreign object 750 on the inductive sense coil's 702 equivalent inductance and equivalent resistance, as well as on the material and the orientation of the foreign object 750. In the frequency domain, this modulation can be observed as modulation harmonic sidebands up to several orders, as illustrated by the frequency spectrum 1000 of FIG. 10.

Figure 10:
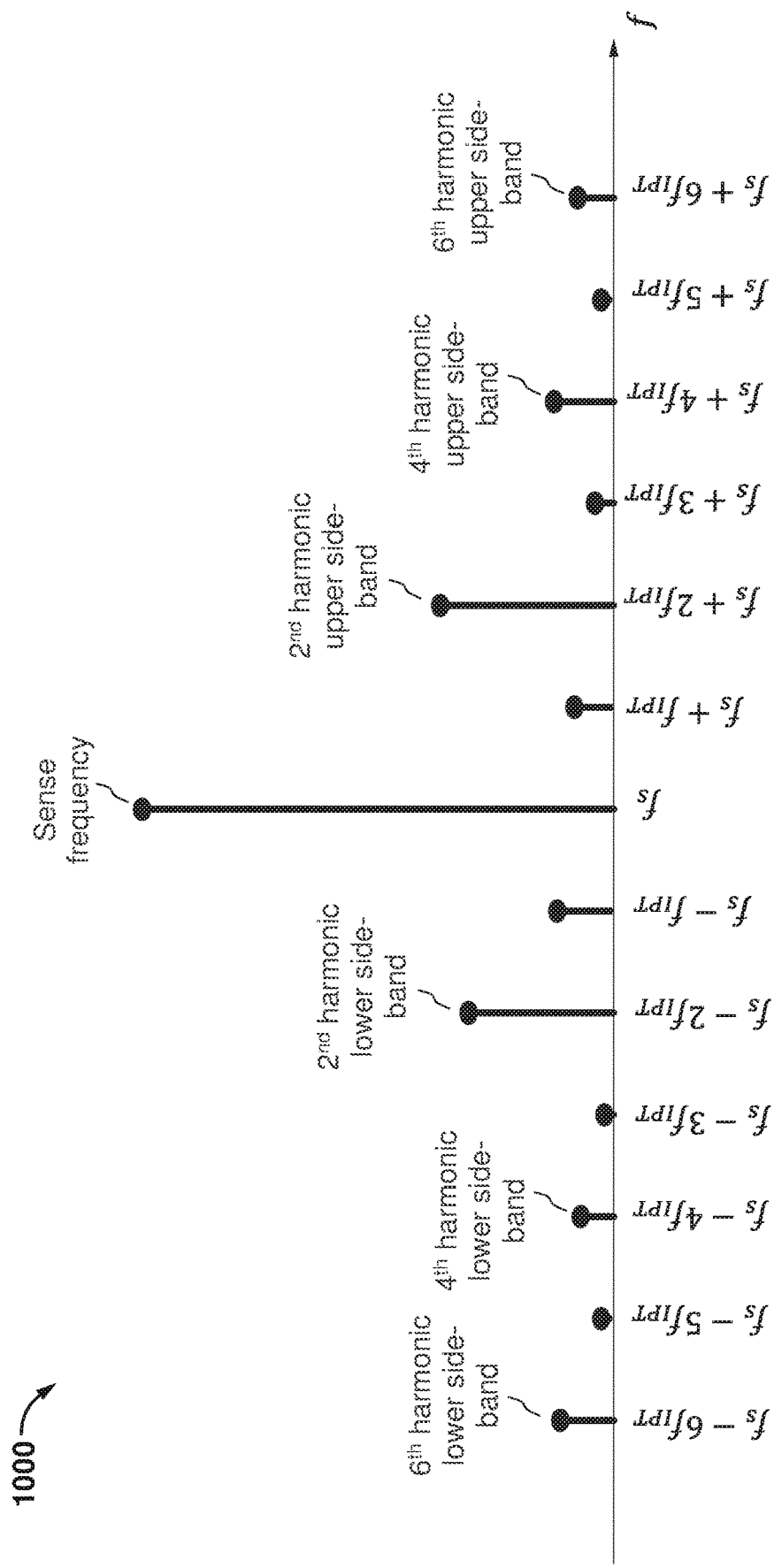
FIG. 10 is a diagram illustrating a frequency spectrum of a voltage signal sensed at an inductive sense coil measurement port while a ferromagnetic foreign object is exposed to a biasing alternating magnetic field, in accordance with some implementations.

FIG. 10 is a diagram illustrating a frequency spectrum 1000 of a voltage signal sensed at an inductive sense coil measurement port while a ferromagnetic object is exposed to a biasing alternating magnetic field $\vec{B}_{exp}(t)$, in accordance with some implementations. If the alternating magnetic field $\vec{B}_{exp}(t)$ is the IPT magnetic field, modulation harmonics generally may occur at the harmonics of the IPT frequency $f_{IPT}$ (e.g., $f_s \pm n \cdot f_{IPT}$, where n is the order of the modulation harmonic). In theory, since the modulation mechanism is independent of the sign of the alternating magnetic field $\vec{B}_{exp}(t)$, no substantial odd order harmonics are expected, which can be seen by the substantially zero voltage level of any of the $3^{rd}$ and $5^{th}$ order harmonics shown in spectrum 1000. However, in practical systems some residual first order (e.g., $f_s \pm f_{IPT}$) and other odd order harmonic products may be observed, attributable to some non-linear distortion effects in the analog signal processing.

Figure 11:
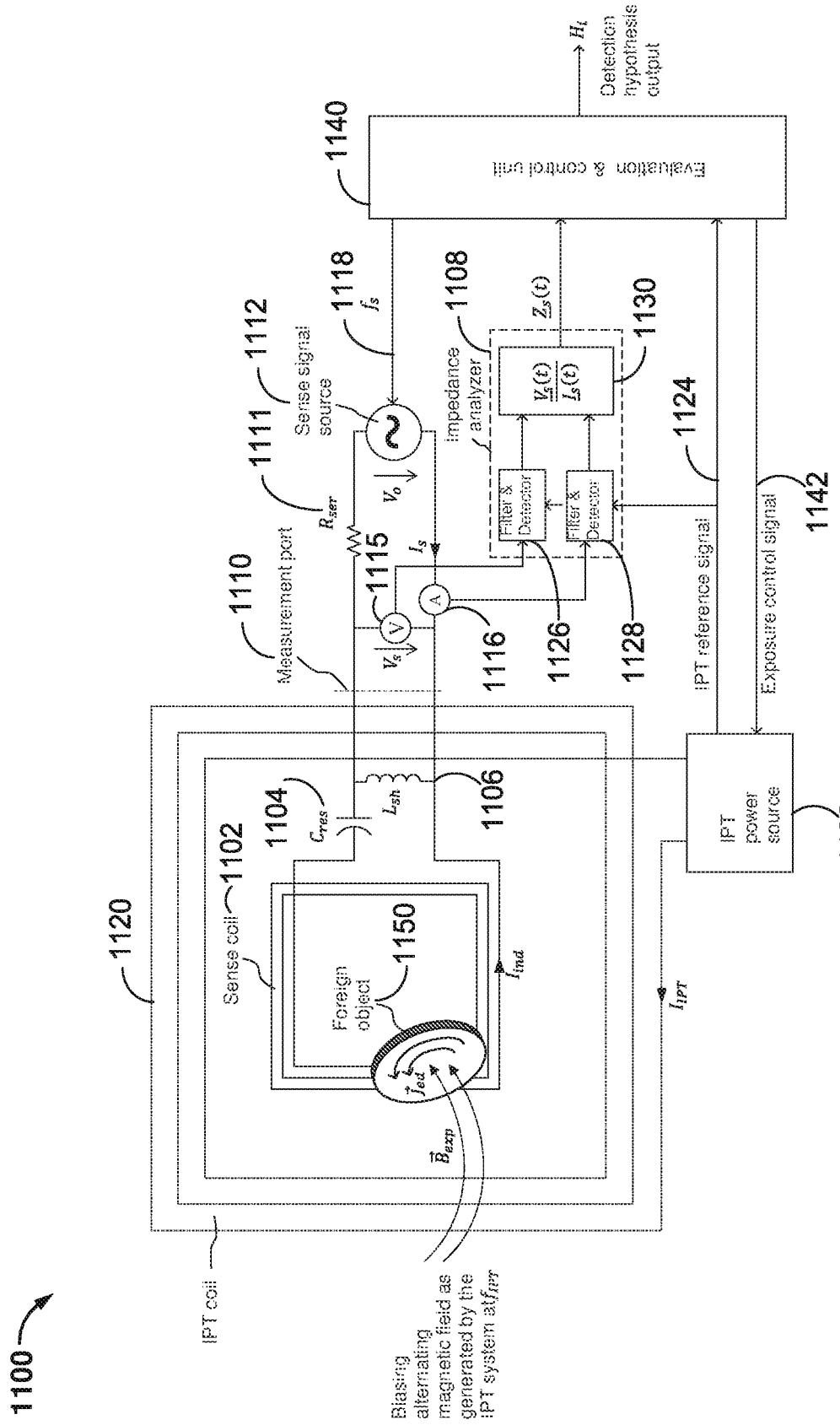
FIG. 11 is a diagram of a ferromagnetic foreign object detection circuit based on a continuous waveform response approach, in accordance with some implementations.

FIG. 11 is a diagram of a ferromagnetic foreign object detection circuit 1100 based on a continuous waveform response approach, in accordance with some implementations. As shown in FIG. 11, an IPT coil 1120 and a IPT power source 1122 may be used to magnetically bias ferromagnetic foreign objects (e.g., the foreign object 1150) with an alternating magnetic field $\vec{B}_{exp}(t)$. The circuit 1100 includes an inductive sense coil 1102 connected in series with a capacitor $C_{res}$ 1104, and a shunt inductor $L_{sh}$ 1106 connected in parallel with the series combination of the capacitor 1104 and the coil 1102. The circuit 1100 additionally includes a measurement port 1110, indicated by the dashed line, in parallel with the shunt inductor 1106. The measurement port 1110 includes a voltage sensor 1115 and a current sensor 1116 and is further connected to a sense signal voltage source 1112 via a series resistor $R_{res}$ 1111. The sense signal voltage source 1112 is configured to generate a sinusoidal (harmonic) sense signal and further includes an input for controlling the sense frequency $f_s$.

The circuit 1100 further comprises an impedance analyzer 1108 that is configured to receive, as inputs, the outputs of the voltage sensor 1115 and the current sensor 1116. The impedance analyzer 1108 is further configured to output an impedance $Z_s(t)$ determination to an evaluation & control unit 1140 and to receive an IPT reference signal 1124 for frequency and phase synchronization purposes from the IPT power source 1122.

The evaluation & control unit 1140 controls the sense frequency $f_s$ via an output 1118 provided to the sense signal voltage source 1112 and also controls the alternating magnetic field $\vec{B}_{exp}(t)$ via another output 1142 provided to the IPT power source 1122. The evaluation & control unit 1140 additionally comprises an input to receive the IPT reference signal 1124 from the IPT power source 1122, which in addition to frequency and phase may also reflect a current level, a power level, or any other operational status of the IPT power source 1122. The evaluation & control unit 1140 also includes an output for providing a detection hypothesis $H_i$.

The series capacitor $C_{res}$ 1104 in combination with shunt inductor $L_{sh}$ 1106 serves as a high pass filter to attenuate the voltage induced in the inductive sense coil 1102 by the alternating magnetic field $\vec{B}_{exp}(t)$ at the IPT frequency $f_{IPT}$. Attenuating this low frequency component may generally relax requirements on the voltage sensor 1115, the current sensor 1116 and the impedance analyzer 1108 and may also reduce any non-linear distortion effects such as cross-modulation between any low and high frequency signal components. The capacitor $C_{res}$ 1104 will also lower a current component $I_{ind}$, at the IPT frequency $f_{IPT}$, induced in the inductive sense coil 1102, which will lower consequent Joule heating effects in the inductive sense coil 1102. Self-heating of the inductive sense coil 1102 may exert a disturbing effect when sensing objects via a change of their temperature. The capacitor $C_{res}$ 1104 may also serve to fully or partially compensate for the reactance of the inductive sense coil 1102 at the sense frequency $f_s$, as will be outlined in more detail below. The series resistor $R_{res}$ 1111 may serve to limit the sense current $I_s$, e.g., if the sense circuit 1100 is tuned to resonance (e.g., full compensation) to minimize an impedance at the measurement port 1110.

In some implementations, the shunt inductor $L_{sh}$ 1106 may be omitted or reduced in physical size (e.g., for a lower current rating). In such implementations, the circuit 1100 may actively cancel or minimize the IPT frequency ($f_{IPT}$) voltage component at the measurement port 1110 by using a signal voltage source (e.g., sense signal voltage source 1112) that generates a high frequency sense signal superimposed over a low frequency compensation signal (e.g., at the IPT frequency $f_{IPT}$). The circuit 1100 may then adjust an amplitude and/or a phase of the low frequency compensation signal so as to minimize the IPT frequency voltage at the measurement port 1110.

In some other implementations, the shunt inductor $L_{sh}$ 1106 may be an "air coil" not including any ferrite core. This may be required to avoid any modulation effect that may be produced by a ferrite core in the presence of the current component $I_{ind}$. Since shunt inductor $L_{sh}$ 1106 is connected in parallel at the measurement port 1110, even very weak modulation effects may seriously desensitize detection of the foreign object 1150.

Selecting a suitable sense frequency requires particular attention. The fundamental frequency, the harmonic frequencies, and other switching noise of the IPT system may potentially interfere or cross-modulate with the sense signal thus desensitizing foreign object detection. With respect to the circuit 1100 of FIG. 11, and considering the values of the capacitor $C_{res}$ 1104, the inductor $L_{sh}$ 1106, and other design constraints, substantial attenuation of the fundamental frequency and noise may be achieved at frequencies well above 150 kHz, preferably in the MHz range. Another aspect for consideration is sensitivity to capacitive effects and thus to non-metallic dielectric objects (e.g. water, snow, ice, etc.). Capacitive effects may be explained by a parasitic electric field that is also generated by the inductive sense coil at high frequency. Sensitivity of electric fields may become an issue at frequencies above 10 MHz. In view of these factors, a sense frequency well above $f_{IPT}$, e.g., in the frequency range 1 to 10 MHz, may be a good trade off.

A quantity representative of the inductive sense coil's equivalent inductance and equivalent resistance may be the complex impedance $\underline{Z}_s$ that is a function of time (e.g., is modulated) when the foreign object 1150 is present. This notion of an impedance may be applied if the sense signal is a continuous sinusoidal wave and if the sense frequency $f_s$ is significantly higher than the modulation frequency (e.g., $f_{IPT}$), which may hold for sense frequencies $f_s$ in the MHz range. For other excitations, the notion of an impedance may not be appropriate.

In some implementations, the time varying complex impedance $\underline{Z}_s(t)$ may be obtained by sensing the voltage $V_s$ and the current $I_s$ at the measurement port 1110. In more detail, the complex impedance $\underline{Z}_s(t)$ is obtained by filtering and envelope detection of the sensed voltage $V_s$ and the sensed current $I_s$ in the filter & detector module 1126 and the filter & detector module 1128, respectively, to obtain the complex voltage envelope $\underline{V}_s(t)$ and the complex current envelope $\underline{I}_s(t)$ (e.g., the modulation waveforms). The filter & detector module 1126 may then output the complex voltage envelope $\underline{V}_s(t)$ and the filter & detector module 1128 may then output the complex current envelope $\underline{I}_s(t)$ to the module 1130 that computes the quotient $\underline{Z}_s(t)=\underline{V}_s(t)/\underline{I}_s(t)$. The filters within the modules 1126 and 1128 may be matched filters that reduce noise with minimal distortion of the voltage $\underline{V}_s(t)$ and current $\underline{I}_s(t)$ modulation waveforms. In addition, the filter & detector modules 1126 and 1128 may be frequency and/or phase synchronized to the alternating magnetic field $\vec{B}_{exp}(t)$ by receiving the IPT reference signal 1124 from the IPT power source 1122.

In some implementations, the complex impedance $\underline{Z}_s(t)$ may be measured with a frequency $f_s$, substantially at resonance, as essentially defined by the inductive sense coil's inductance $L_{sc}$ (not shown in FIG. 10) and the capacitance $C_{res}$ 1104. However, measuring the impedance $\underline{Z}_s(t)$ at resonance should not be construed as a general necessity for a foreign object detection method. However, resonance may be advantageous to reduce dynamic range requirements for the voltage 1115 and current 1116 sensors and for the impedance analyzer 1108. While an absolute impedance change (e.g., $2\pi f_s \Delta L_{sc}$) due to the presence of the foreign object 1150 is independent of any reactance compensation, the relative (e.g., percentage) change becomes more significant if the gross voltage across the inductive sense coil 1102 is compensated for by tuning the sense frequency $f_s$ to resonance since it is the relative impedance change that determines the dynamic range requirements of the voltage sensor 1115, the current sensor 1116 and the components within the impedance analyzer 1108. Further benefits of resonance tuning are discussed below.

The evaluation unit 1140 may further process and compare the detected complex impedance waveforms $\underline{Z}_s(t)$ against a reference waveform, also taking into account information received via the IPT reference signal 1124, to finally select a detection hypothesis $H_i$. Such reference waveforms may be obtained in a system calibration process.

In some implementations, the evaluation & control unit 1140 may be configured to determine the presence of the foreign object 1150 based on detecting a predetermined level or amount of modulation and on other distinct characteristics in the detected complex impedance waveforms $\underline{Z}_s(t)$. These characteristics (e.g., the modulation harmonics) may be analyzed in the time domain or in the frequency domain (e.g. by a Fourier series).

In some other implementations, the evaluation & control unit 1140 may also correlate the determined complex impedance waveform $\underline{Z}_s(t)$ with the duty cycles of the intermittent alternating magnetic field $\vec{B}_{exp}(t)$ to determine the presence of the foreign object 1150 via the alternating magnetic field biasing and/or via the heating effect.

Figure 12:
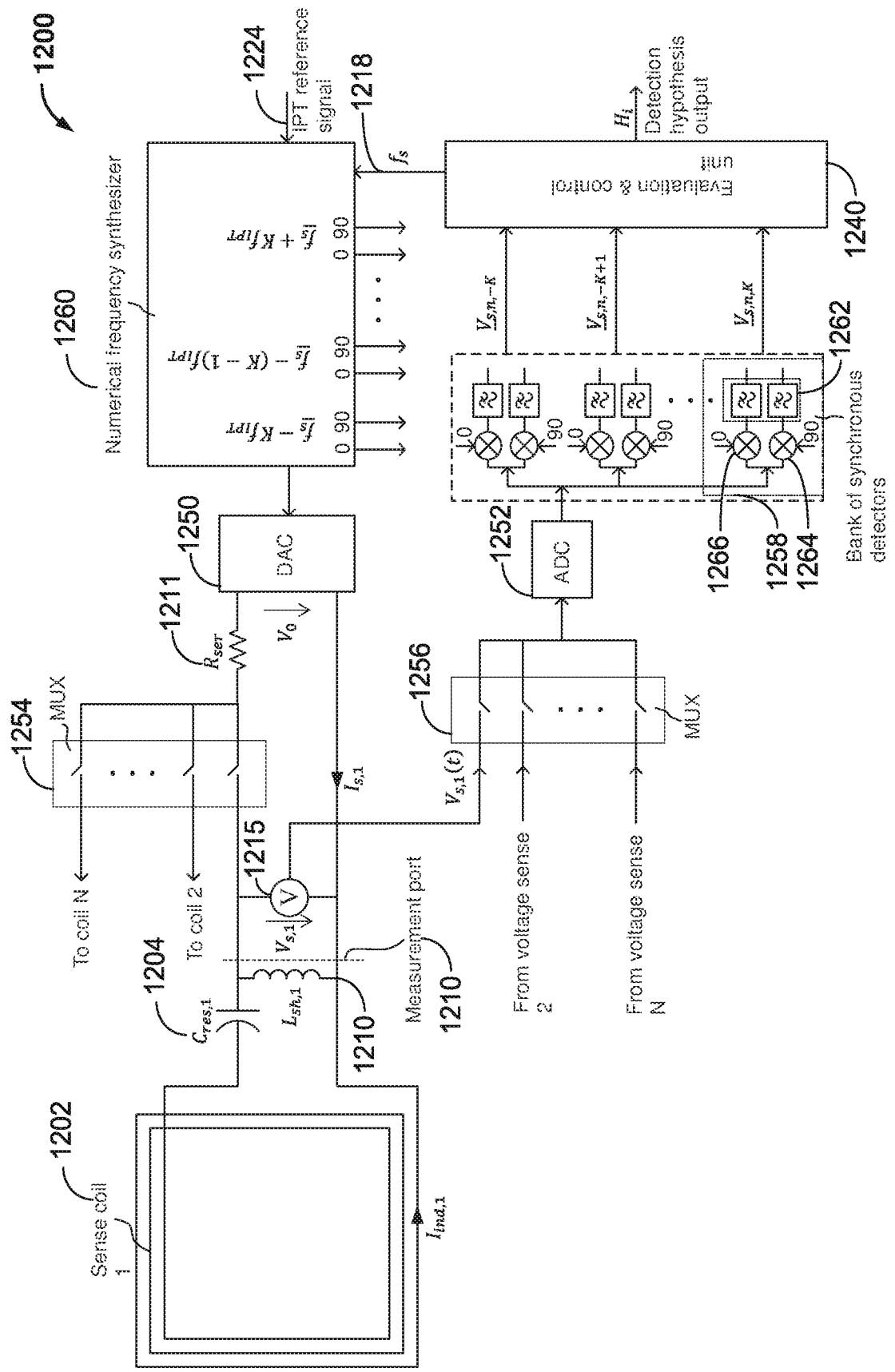
FIG. 12 is a diagram of another ferromagnetic foreign object detection system based on a continuous waveform response approach, in accordance with some implementations.

FIG. 12 is a diagram of another ferromagnetic foreign object detection circuit 1200 based on a continuous waveform response approach, in accordance with some implementations. The circuit 1200 may determine the presence of a ferromagnetic object (not shown) based on a frequency domain processing approach. The circuit 1200 utilizes a plurality (N) of inductive sense coils (e.g., a coil array, not completely shown in FIG. 12) including the inductive sense coil 1202, in order to provide sufficient detection sensitivity over an entire surface area of an IPT coupler (e.g. a base pad, not shown in FIG. 12). For the sake of clarity, FIG. 12 omits portions of the IPT system (as shown in FIG. 11) that may be used for the foreign object detection process. The circuit 1200 is substantially the same as that shown in FIG. 11 except that it includes multiplexers 1254 and 1256 (e.g., comprising N analog switches) and omits the current sensor 1116.

In this detection circuit 1200 the sense signal source (1112 as shown in FIG. 11) is accomplished by a numerical frequency synthesizer 1260 that feeds into a Digital-to-Analog Converter (DAC) 1250. The DAC 1250 provides a voltage source output $V_o$ connected to a measurement port 1210 (denoted by the dotted line) via a series resistor $R_{ser}$ 1211 and the multiplexer 1254. The DAC 1250 may include analog signal restoration filters (not shown in detail in FIG. 12) as needed to generate a clean sense voltage signal. The resistor $R_{ser}$ 1211 may also include the on-state resistance of the respective switch within the multiplexer 1254. FIG. 12 shows the resistor $R_{ser}$ in common with a plurality of N inductive sense coils (not shown). However, in some implementations it may be preferable to connect the multiplexer 1254 directly to the sense signal source (e.g., the DAC 1250) and to use N resistors downstream (e.g., to the left, at the outputs) of the multiplexer 1254. This configuration may have less issues with parasitic parallel capacitances from analog switches at the measurement port 1210.

The DAC 1250 output voltage $V_o$ and the resistor $R_{ser}$ 1211 may be selected to act substantially as a constant alternating current (AC) source driving a quasi-constant sinusoidal current $I_{s,l}$ into the inductive sense coil that is selected by the multiplexer 1254. Alternatively, the DAC 1250 may provide a constant AC source output not requiring the series resistance $R_{ser}$ 1211. Assuming a defined, constant sense current $I_{s,l}$, the sensed voltage $V_{s,i}$ at the measurement port 1210 of the i-th sense circuit (other circuits not shown) may be considered to directly reflect the impedance $\underline{Z}_{s,i}$.

Furthermore, FIG. 12 shows each of the N voltage sensor outputs connected to an Analog-to-Digital Converter (ADC) 1252 via a second multiplexer 1256 (e.g., comprising N analog switches). The voltage sensor 1215 and/or the ADC 1252 may include analog signal preconditioning circuitry such as pre-amplifying and/or anti-aliasing filters that are not shown in detail in FIG. 12. Narrowband filtering and detection of the complex voltage waveform may then be performed in the digital (numerical) domain. The voltage waveform $V_{s,i}(t)$, which is input to the ADC 1252 via the multiplexer 1256, is analyzed in the Fourier (e.g., frequency) domain using a bank of 2K+1 synchronous detectors 1258, one for each modulation side band frequency, as previously described in connection with FIG. 10. A suitable value for K may be any of 2, 3, 4, although the present application is not so limited such that K may have any integer value.

Each synchronous detector 1258 (e.g., within the bank 1268) provides an in phase mixer 1266, a quadrature mixer 1264, a low pass filter 1262 and a complex (in-phase and quadrature) output delivering a complex amplitude (e.g., representing a Fourier coefficient) denoted by $\underline{V}_{s,n,k}$, where n refers to the n-th sense coil and k to the k-th order modulation harmonic, where $|k| \leq 2K$. The zero-order modulation harmonic $\underline{V}_{s,n,0}$ refers to the sense carrier signal component and is obtained by mixing $V_{s,i}(t)$ with a sinusoidal quadrature waveform with frequency $f_s$. The low pass filter 1262 may be a Finite Impulse Response (FIR)-type filter dimensioned with respect to filtering requirements and detection time constraints. In a foreign object detection system using N inductive sense coils and time multiplexing, available detection time for each sense coil reduces to $1/N^{th}$ that of an available detection time for the circuit 1100 of FIG. 11.

The numerical frequency waveforms (0°, 90°) input to the in-phase and quadrature mixers, respectively, are generated by a numerical frequency synthesizer 1260 with frequencies as exemplarily indicated in FIG. 10. In some implementations, all frequency waveforms may be based on the sense frequency $f_s$ 1218 received from the evaluation & control unit 1240 and on the external IPT reference signal 1224 received from IPT transfer system. In some implementations, the IPT reference signal 1224 is derived from the residual IPT frequency voltage as it may be sensed at the measurement port of the $i^{th}$ sense circuit. The numerical frequency synthesizer 1260 may include means for frequency and phase synchronizing an internal numerical oscillator to the external IPT reference signal 1224.

The evaluation & control unit 1240 may determine the presence of a potential object by comparing a detected set of complex outputs ($V_{s,n,K}$) against a set of reference values using an appropriate threshold. The reference values may be obtained in a process of system calibration. Moreover, the evaluation & control unit 1240 may correlate time sequences of consecutively detected sets of outputs with the alternating magnetic field intervals, e.g., for detecting objects via the magnetic field biasing and/or heating effect. The zero-order coefficient $\underline{V}_{s,n,0}$ may be of particular relevance in such a correlation approach.

In some implementations, the real and imaginary components of the complex voltage $\underline{V}_{s,n,0}$ should reflect an inductive sense coil's 1202 equivalent resistance and equivalent inductance, respectively, requiring true mapping of the complex voltage. True voltage (e.g., impedance) mapping may provide most of the information for discriminating between potential objects and other disturbances. However, true voltage mapping may require the system to compensate for any phase error that is introduced by the analog circuitry between the DAC 1250 and the ADC 1252. This phase error may generally vary with frequency, with the selected sense coil 1202, and also with the temperature and age of components within the circuit 1200.

Therefore, in some implementations the evaluation & control unit 1240 performs phase correction by the following procedure. First, the sense frequency $f_s$ 1218 is tuned to minimize the magnitude of $\underline{V}_{s,n,0}$. At this frequency the impedance at the measurement port 1210 should, ideally, be purely resistive (zero phase), neglecting the effect of the shunt inductor $L_{sh}$ 1206, which allows the circuit 1200 to determine phase error. Knowing the phase error, the circuit 1200 may perform phase zeroing by rotating the voltage phasor $\underline{V}_{s,n,0}$ by an amount of measured phase error to cancel the measured phase error. This procedure may provide a sufficiently accurate phase calibration as needed for true voltage (e.g., impedance) mapping.

In some implementations, phase correction may also be required for the IPT frequency component (e.g., to be substantially in phase synchronicity with the voltage induced into the inductive sense coil 1202 at the IPT frequency $f_{IPT}$). Such correction may be performed by the numerical frequency synthesizer 1260 individually for each of the inductive sense coils 1202.

Ferrites used in the IPT coupler (not shown), in the shunt inductor $L_{sh}$ 1206, and other inherent non-linearity within the circuit 1200 may produce a certain degree of impedance modulation. Such intrinsic modulation effects may be nullified in a calibration process.

Switching noise harmonic content produced by the IPT power source may be coupled into the inductive sense coil 1202 via the IPT coupler coil (not shown) and may fall on frequencies where foreign object detection is sensitive (e.g., the sense carrier frequency $f_s$ and modulation side-bands). Therefore, the circuit 1200 may perform active interference avoidance by intelligently controlling the sense frequency $f_s$ in a manner such that the IPT harmonics remain outside of any of the sensitive frequency ranges, as defined by the bandwidth of each of the synchronous detectors 1262, while remaining substantially at resonance. Conversely, the system may adjust the IPT frequency $f_{IPT}$ by a small amount.

Potential interference of an IPT frequency harmonic with any of the relevant modulation side-band harmonics can be identified by a passive detection performed by the bank of synchronous detectors 1262 and the evaluation & control unit 1240 when the high frequency sense signal (e.g., $V_o$ driving $I_{s,t}$ at the DAC 1250) is switched off. Any potential interference may be detected as an increased signal level at any of the detector 1262 outputs. When interference is detected, the evaluation & control unit 1240 may slightly adjust the sense frequency $f_s$ 1218, slightly shifting the frequency of the numerical frequency synthesizer 1260 until the interference disappears or drops below an acceptable threshold.

The IPT power source (not shown) may also generate broadband noise that cannot be mitigated by shifting the sense frequency $f_s$. To some degree, the IPT power source may also modulate an impedance appearing at the measurement port 1210. This may be explained by variations of the output impedance of the IPT power source (e.g. 1122 with reference to FIG. 11) and some coupling between the inductive sense coil 1202 and the IPT coupler coil (e.g., 1120 with reference to FIG. 11). These output impedance variations may also exhibit a spectrum with a fundamental frequency that is twice the IPT frequency $f_{IPT}$.

Therefore, the circuit 1200 may implement special means to stabilize the output impedance and to reduce broadband noise in the sense frequency range. Such means may include high frequency filters (isolators) inserted between a power converter and the IPT coupler of the IPT system. These means may be considered an integral part of an IPT tuning and matching network. The means may further include special measures in the IPT control system, and particularly in the generators of the pulse width modulated (PWM) drive waveforms, for smooth (transient-free) control and to minimize jitter. The above methods for reducing noise and impedance modulation may also apply to the IPT power sink (e.g., the IPT receiver, not shown), which may similarly disturb an inductive foreign object detection process.

The basic concept of detecting ferromagnetic metallic objects via alternating magnetic field biasing and by eddy current heating may also principally apply to an impulse response (pulse induction) detection technique, since the presence of a ferromagnetic object may also modify the impulse response of an inductive sense coil, which may be a function of a strength of a biasing magnetic field and of the object's temperature. Such an impulse response detection implementation may not need resonance tuning.

Figure 13:
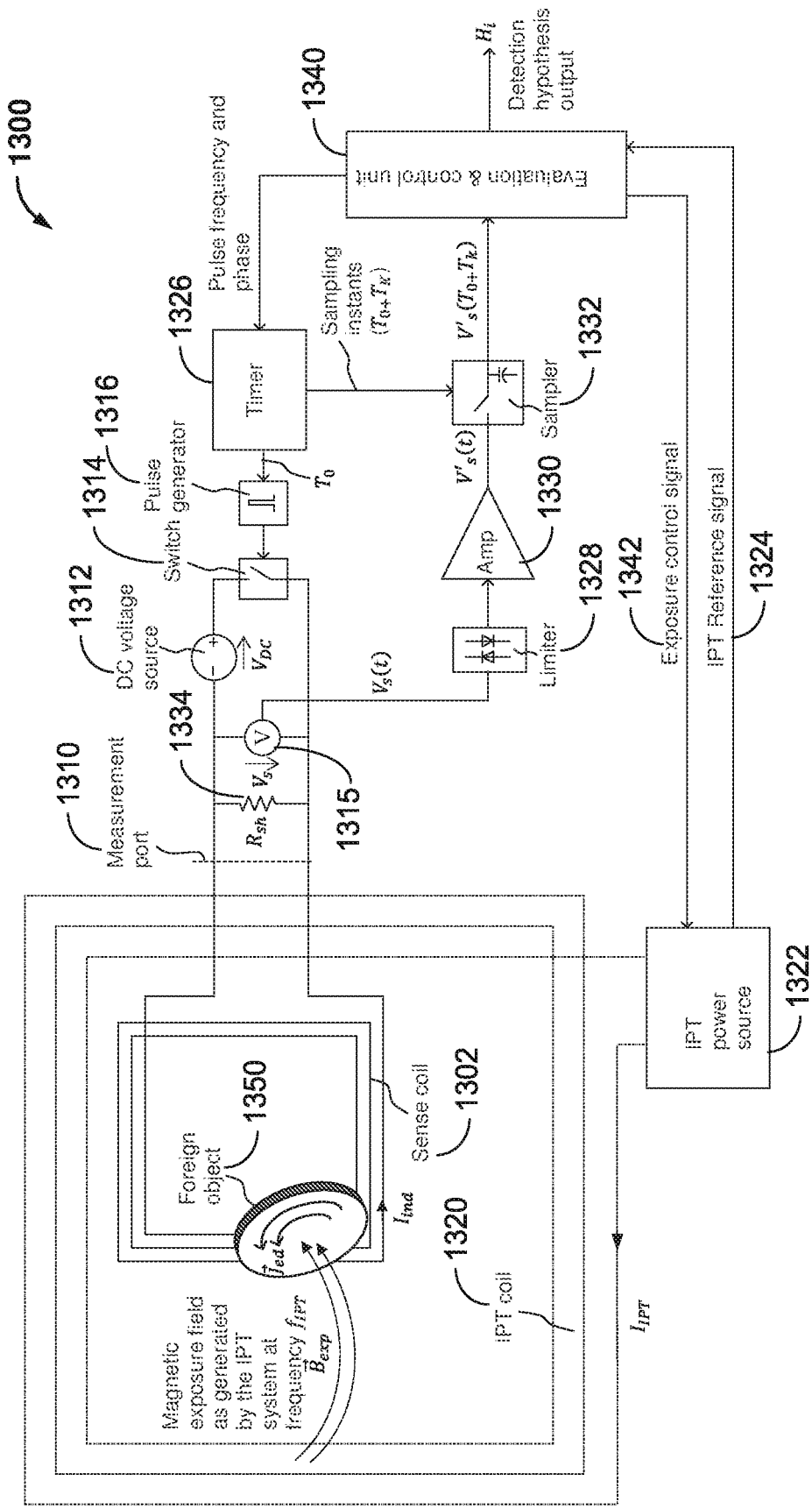
FIG. 13 is a diagram of yet another ferromagnetic foreign object detection system based on an impulse response approach, in accordance with some implementations.

FIG. 13 is a diagram of yet another ferromagnetic foreign object detection circuit 1300 based on an impulse response approach, in accordance with some implementations. In operation, an inductive sense coil 1302 is current charged across a DC voltage source 1312 for a short period of time. At a time $T_0$, the inductive sense coil 1302 is disconnected from the DC voltage source 1312 and discharged across a shunt resistor 1334, ideally without ringing. Finally, the voltage $V_s$ as measured across the inductive sense coil 1302 is sampled at least at one defined time instant $T_0+T_k$ and compared to at least one reference value.

FIG. 13 additionally shows relevant portions of the IPT system. The circuit 1300 is characterized by a timer circuit 1326 controlling a pulse generator 1316, which defines the current charge time $T_o$, a switch 1314 controlled by the pulse generator 1316 for executing the charging pulse, the DC voltage source $V_{DC}$ 1312 for charging the inductive sense coil 1302 during the sense pulse, a voltage sensor 1315 for sensing a voltage $V_{s(t)}$ at the measurement port 1310 during the discharging period, and a shunt resistor $R_{sh}$ 1334 dimensioned for a fast discharge across the inductive sense coil 1302. A limiter 1328 may receive the output of the voltage sensor 1315 for limiting (e.g., clipping) the level of the measurement signal to a range of interest while also preventing saturation of an amplifier 1330 that receives the output of the limiter 1328. An output of the amplifier 1330 is input to a sampler 1332 configured to sample the voltage impulse response $V'_s(t)$ at a number K of time instants $T_0+T_k$, k=1 . . . K as controlled by the timer 1326. An evaluation & control unit 1340 evaluates consecutively detected voltage samples $V'_s(T_0+T_k)$ and determines a presence of a ferromagnetic object (e.g., the foreign object 1350) by comparing the voltage samples against a set of reference values.

In a preferred implementation, the foreign object 1350 is detected by periodically applying a voltage pulse to the inductive sense coil 1302. Pulsing may be performed in synchronicity with the IPT frequency $f_{IPT}$ with a pulse rate equal to, or an integer multiple of, the IPT frequency $f_{IPT}$ and having a pulse phase adjusted to a suitable time instant with respect to an IPT reference signal 1324, supplied to the evaluation & control unit 1340 by the IPT power source 1322, and with respect to switching transients that may be present in a real IPT system. This pulsing may be driven by exposure control signal 1342 output from the evaluation & control unit 1340. The evaluation & control unit 1340 may be configured to determine a presence of the foreign object 1350 based on consecutively sampled impulse responses by analyzing a degree of modulation (e.g., change), a degree of correlation with the alternating magnetic field exposure intervals, and other characteristics as sensed in the acquired time series.

Moreover, expansion of the impulse response implementation to a plurality (array) of inductive sense coils may not require a multiplexer in the sense pulse generating portion of the sense circuit 1300, since a respective pulse switch 1314 may individually provide a respective pulse to only one sense coil at a time. The DC voltage source 1312 may be common to a number of sense circuits, whilst the shunt resistor $R_{sh}$ 1334, the voltage sensor 1315, and the limiter 1328 may be individual for each inductive sense coil (e.g., coil 1302). Multiplexing of the sensed voltages may be performed downstream (e.g., after) the limiter 1328 or even downstream (e.g., after) the amplifier 1330.

The following may apply to any ferromagnetic foreign object detection circuit as disclosed herein but is described in the context of the foreign object detection circuit as shown in FIG. 13.

Foreign object detection by intermittently exposing foreign objects 1350 to a biasing (modulating) and/or heating alternating magnetic field $\vec{B}_{exp}(t)$ may be applied initially before starting inductive power transfer. If the circuit 1300 determines the presence of the foreign object 1350, the circuit 1300 does not start inductive power transfer. If no object has been detected initially, during regular power transfer, the circuit 1300 may employ at least one foreign object detection process, for example, a process that is suitable for detecting an object that enters the functional space when the system is active (e.g. based on a time differential approach). This may be one of an inductive sensing method that may also partially rely on alternating magnetic field biasing, a radar-based process, and/or any other sensing process. In the event that foreign object detection is signaled, the circuit 1300 may verify such a detection by first ceasing inductive power transfer and then reapplying the process using alternating magnetic field biasing and/or heating. This may particularly apply for cases of low confidence detection. If the previous detection is confirmed, the circuit 1300 may discontinue inductive power transfer. If the previous detection is not confirmed, the circuit 1300 may reactivate inductive power transfer.

Depending on the system capabilities, the biasing and heating alternating magnetic field $\vec{B}_{exp}(t)$ may be generated by transferring real power to a load, e.g., to a battery of an electric vehicle. Alternatively, the magnetic field $\vec{B}_p(t)$ may be generated by disconnecting the vehicle-side load and by generating substantially reactive power in the base IPT coupler 1320 and/or in the vehicle IPT coupler (not shown).

The implementations disclosed herein may be applied more cautiously to prevent hazardous situations from occurring during the alternating magnetic field $\vec{B}_{exp}(t)$ exposure intervals. For example, the alternating magnetic field exposure $\vec{B}_p(t)$ may start at a subcritical level. If no foreign object 1350 is detected, the circuit 1300 may successively increase (e.g., ramp up) the level of magnetic field $\vec{B}_{exp}(t)$ exposure from interval to interval.

Some objects, e.g., paper clips, may change their modulation response considerably with the level of the biasing alternating magnetic field $\vec{B}_{exp}(t)$. These effects, attributable to saturation, may reveal further information useful for determining a presence of the foreign object 1350. Changes in a modulation response may also be observed when changing the frequency of the biasing alternating magnetic field $\vec{B}_{exp}(t)$. Using different levels for the biasing alternating magnetic field $\vec{B}_{exp}(t)$ may also help to discriminate between modulating effects as produced in the environment of an inductive sense coil (1302) e.g. by ferrite in the IPT coupler (not shown) and modulating effects as produced by ferromagnetic foreign objects, since these modulating effects may change differently when the level is altered. Therefore, in some implementations, foreign object detection is performed with at least one of a different level and a different frequency of the biasing alternating magnetic field $\vec{B}_{exp}(t)$.

The methods disclosed herein may be combined with at least one of a time differential approach (e.g., as previously discussed in connection with FIG. 11) and a space differential approach (e.g., as previously discussed in connection with FIG. 12). In a time-differential approach, the foreign object detection system may not apply absolute decision criteria but rather may base decisions on differences between subsequent detector outputs in time sequences of detector outputs. By contrast, in a space-differential approach, the foreign object detection system may determine a presence of a ferromagnetic object based on differences between detector outputs from neighboring inductive sense coils.

Metallic structures in the environment of an inductive sense coil (e.g. the vehicle pad and vehicle underbody) may temporarily move. This may occur, for example, when a person enters or leaves the vehicle or when the vehicle is loaded or unloaded. These movements may seriously disturb inductive sensing based on the above-described processes. Such disturbances are expected to occur substantially simultaneously for a majority of inductive sense coils of a foreign object detection array. Therefore, such a system may discontinue inductive sensing based on alternating magnetic field biasing and/or heating in the event that significant changes of an inductive sense coil's characteristic occur coincidentally on a majority of inductive sense coils.

In some situations, accurate foreign object detection may be compromised by occurrences such as vehicle motion and the like. For example, when a vehicle is rocked by wind or by movement of passengers within the cab, the entire vehicle may shift from side to side and/or up and down. Since the vehicle itself is made of metal, foreign object sense coils within a base pad, for example, may detect the movement of the vehicle chassis and trigger a false positive. Vulnerability to triggering such false positives may reduce the robustness and reliability of such foreign object detection systems. For this reason, methods are desirable that significantly reduce the relative occurrence of such false positives. One such approach includes the periodic recalculation of a dynamic detection threshold for triggering a positive foreign object detection. In such an approach, the dynamic detection threshold may be periodically set and reset to a level that is greater than values that are likely to be sensed at the inductive sense coils during occurrences that would otherwise cause such false positive triggers. Such an approach will be described in connection with FIG. 14 below.

In a first action, an output or measurement signal from each of a plurality of inductive sense coils over a predetermined interval of time is received. This may take place at a predefined, predetermined, or manually settable frequency (e.g., 6.25 times per second, or 6.25 Hz) and for a predetermined interval of time (e.g., 64 loops each measured 6.25 times per second equals 1/(64*6.25)=2.5 ms or less for each predetermined interval without delayed or parallel processing or some sort). However, where parallel processing is utilized, the predetermined interval would increase by a factor equivalent to the number of parallel processing paths. For example, where 4 loops are sampled in parallel, the predetermined intervals would be 4 times as long, e.g., 10 ms.

In a second action, each of the outputs or measurement signals are high pass filtered in order to remove stationary or slow changing components of the output or measurement signals, leaving only indications likely to be "noise," "movement," or "change" occurring on or near the base pad. In some implementations, a 1$^{st}$ order high pass Butterworth filter may be utilized, although any high pass filter of any order may be contemplated.

Figure 14:
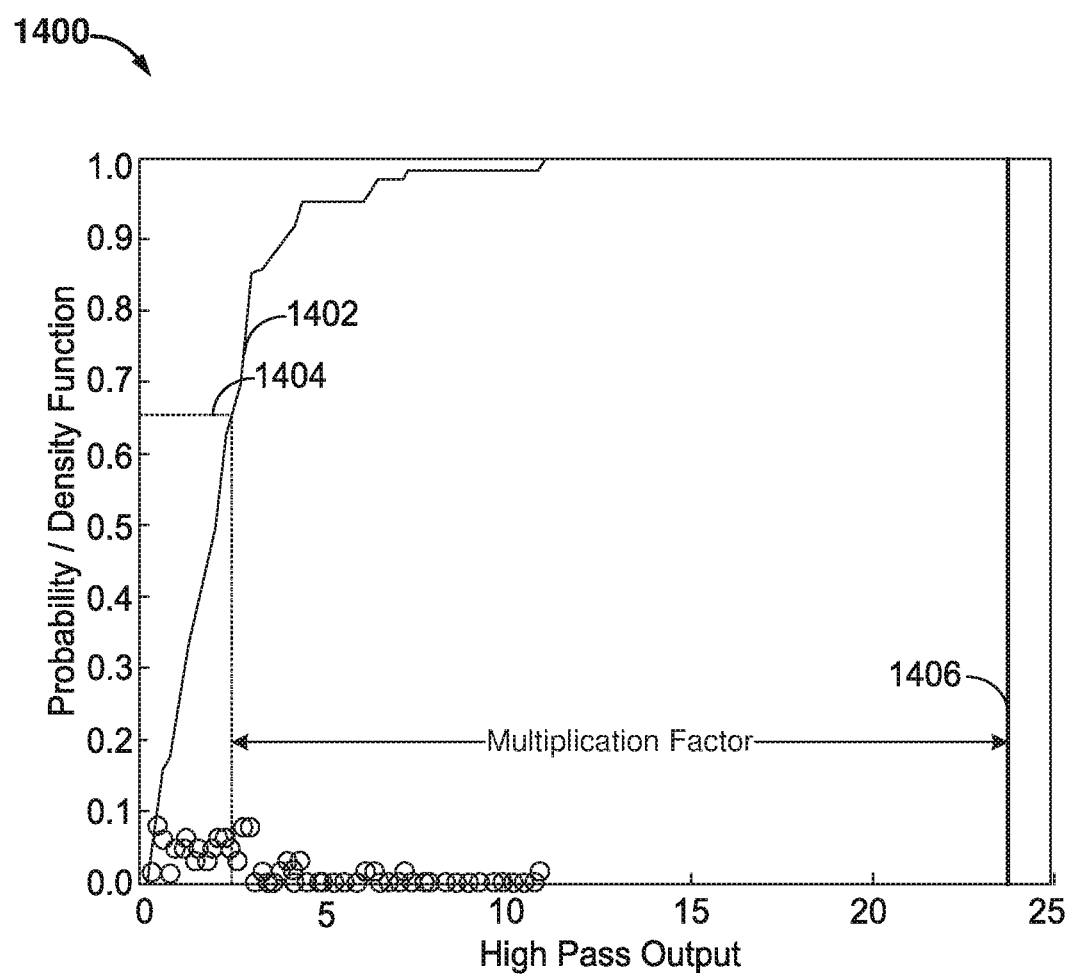
FIG. 14 is a histogram illustrating high-pass filtered sensor data from a plurality of inductive sense coils in a sensing array used to calculate a dynamic foreign object detection threshold, in accordance with some implementations.

In a third action, the high pass filtered outputs or measurement signals are arranged into a histogram that groups the high pass filtered outputs or measurement signals into bins or ranges of potential values for the high pass filtered outputs or measurements, as shown in FIG. 14. Such high pass filtered outputs or measurements may be the absolute values (magnitude) of complex values provide by each of the plurality of sense coils. FIG. 14 is a histogram 1400 illustrating high-pass filtered sensor data from a plurality of inductive sense coils in a sensing array used to calculate a dynamic foreign object detection threshold, in accordance with some implementations. The X-axis illustrates different bins of relative intensity of the high pass filtered sensor data from the plurality of inductive sense coils in a sensing array, in this example 64 bins ranging from 0 to 25 arbitrary intensity units. A plurality of circles are shown as forming the histogram, the height of which above the X-axis indicates the relative number of inductive sense coils from which the high pass filtered sensor data has a relative high pass output intensity in that particular bin or range. The more sense coils returning a high pass filtered output within a particular bin or range of relative output intensity, the higher above the X-axis the circle in that bin. For example, in FIG. 14, relatively more sense coils return low relative high pass output values between 1 and 3, as indicated by the circles in output bins between 1 and 3 being located generally farther from the X-axis than circles outside the 1-3 range. This is to be expected, since any aberrations that remained after high pass filtering would be expected to have low rather than high values.

In a fourth action, a cumulative or normalized histogram line 1402 is determined such that the sum of the heights of all of the circles from the X-axis equals 1.0. Thus, as the line 1402 moves from left to right, sweeping across first low, then high values along the X-axis, the value of the line 1402 increases to a value of 1.0 at the right-most circle.

In a fifth action, a percentile value 1404 is selected or determined, which indicates how many of the plurality of sense coils should be below some arbitrary high pass filtered output value. In the example of FIG. 14, a percentile value 1404 of 0.65 is utilized, corresponding to a high pass output value of about 2.4 on the X-axis.

In a sixth action, the corresponding high pass output value is multiplied by a configuration parameter, or multiplication factor, in order to shift the dynamic threshold to a value that all high pass filtered outputs from the plurality of sense coils are expected to be below when no object is present. In the example of FIG. 14, the configuration parameter or multiplication factor is "10." The dynamic threshold 1406 is shown by a thick vertical line in FIG. 14. In such implementations, if any of the plurality of inductive sense coils have a significantly higher output than the vast majority of the loops, which would be the case were a foreign object to be inserted, these significantly higher outputs will surpass the dynamic threshold 1406.

In a seventh action, a detection time delay is implemented such that a foreign object detection event is triggered only after the significantly higher output consistently exceeds the dynamic threshold 1406 for a predetermined or adjustable interval of time (e.g., 1 second). By tuning one or more of the sample frequency, percentile value, multiplication factor, and the delay interval the algorithm may be tuned for optimum detection of small (e.g., low response) or large (e.g., high response) objects. In some other implementations, multiple instances of the above-described algorithm may be implemented in parallel to provide increased sensitivity for different kinds or types of critical objects.

It may be desirable to be able to discriminate between the type of object that is located in the sensing area or volume between the wireless power transmitter and the wireless power receiver. Thus, the following description with respect to FIG. 15 illustrates some implementations in which the type of object, or what it is made of, can be differentiated based on sensing relative changes in the equivalent reactance and resistance values of the sense coils between a "no object present" condition and an "object present" condition.

Figure 15:
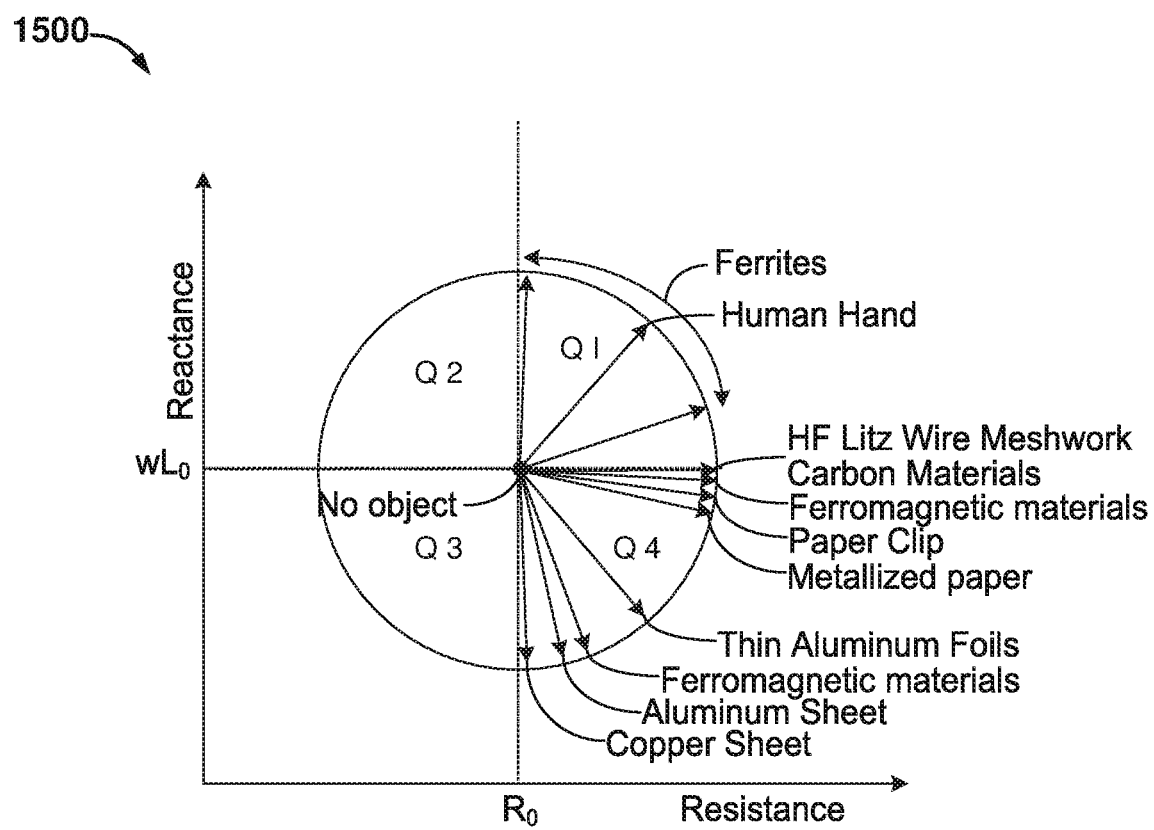
FIG. 15 is a graph illustrating an observed relationship between relative changes in reactance and resistance of a sense coil in a "no object present" condition and in an "object present" condition, in accordance with some implementations.

FIG. 15 is a graph 1500 illustrating an observed relationship between relative changes in reactance and resistance of a sense coil in a "no object present" condition and in an "object present" condition, in accordance with some implementations. As previously described, a sense coil may have a measurable equivalent reactance (e.g., inductance in Henries) and an equivalent resistance (e.g., resistance in Ohms). FIG. 15 shows an example reactance of $j\omega L_0$ Ohms (imaginary component of the impedance) and $R_0$ Ohms (real component of the impedance) when no object is present in the detection volume (at dot 1502). It has been observed that the material from which an object is made, when present in the detection volume, can be determined based on an impedance change angle (e.g., the relationship between a change in the imaginary component, or reactance, and a change in the real component, or resistance) of the sense coil; specifically, based on an angle that a line connecting the complex impedance of the sense coil when no object is present with the complex impedance of the sense coil when the object is present makes with a horizontal line extending through the complex impedance of the sense coil when no object is present. For example, materials that cause an increase in both the equivalent reactance and the equivalent resistance of the sense coil cause an impedance change toward a "first quadrant" of the impedance change plane represented by FIG. 15. Similarly, materials that cause an increase in equivalent reactance and a decrease in equivalent resistance cause an impedance change toward a "second quadrant" of the impedance change plane. Materials that cause a decrease in both equivalent reactance and equivalent resistance cause an impedance change toward a "third quadrant" of the impedance change plane. Materials that cause a decrease in equivalent reactance and an increase in equivalent resistance cause an impedance change toward a "fourth quadrant" of the impedance change plane.

As shown, objects that cause an impedance change toward the "first quadrant" would include ferrites, ferrimagnetic materials, and living objects (e.g., a human hand), while objects that cause an impedance change toward the "fourth quadrant" would include critical objects in which eddy currents may easily be induced, causing undesirable inductive heating. Specific example shift angle ranges for each of a copper sheet, an aluminum sheet, a yogurt cup cover, thin aluminum foils, metallized paper, a paper clip, ferromagnetic materials such as steel, and high frequency Litz wire meshwork and carbon materials are shown as residing in the "fourth quadrant" of impedance change shifting. Thus, as intimated by FIG. 15, more granular discrimination than simply "critical object" or "non-critical object" may be made based on the angle of the impedance shift, or essentially, the relationship (or comparison) between how much and in which direction the reactance changes and how much and in which direction the resistance changes. Thus, the high pass filtered output previously described in connection with FIG. 14 may be utilized to determine the above-described angle or make the above-described comparison between the change in reactance and the change in resistance of the sense coil. For example, a change in the real resistance may be determined according to Equation 1 below, while a change in the reactance may be determined according to Equation 2 below.

$$\Delta RE = R_{CURRENT} - R_{NONE} \quad \text{EQ. 1:}$$

$$\Delta IM = IM_{CURRENT} - IM_{NONE} \quad \text{EQ. 2:}$$

where $\Delta RE$ is the change in resistance of the sense coil, $R_{CURRENT}$ is the currently measured resistance (resistance with the object present), $R_{NONE}$ is the resistance when no object is present, $\Delta IM$ is the change in reactance of the sense coil, $IM_{CURRENT}$ is the currently measured reactance (reactance with the object present), $IM_{NONE}$ is the reactance when no object is present. Since samples utilized for calculation of Equations 1 and 2 may have been previously high pass filtered calibration data of $R_{NONE}$ and $IM_{NONE}$ are not required. However, since slow changes in the values of $R_{NONE}$ and $IM_{NONE}$ due to temperature or aging are filtered out, the actual values of $R_{NONE}$ and $IM_{NONE}$ may drift over time.

An angle of the change in impedance may be determined according to Equation 3 below.

$$\theta = \text{atan } 2(\Delta IM, \Delta RE) \quad \text{EQ. 3:}$$

where $\theta$ is the impedance change angle in radians and atan2 ($\Delta IM$, $\Delta RE$) is the inverse tangent ($\tan^{-1}$) or arc tangent (arctan) operation equal to:

$\tan^{-1}(\Delta IM/\Delta RE)$ for $x>0$ $\tan^{-1}(\Delta IM/\Delta RE)+\pi$ for $y\geq 0$, $x<0$ $\tan^{-}(\Delta IM/\Delta RE)-\pi$ for $y<0$, $x<0$ $+\pi/2$ for $y>0$, $x=0$ $-\pi/2$ for $y=0$, $x=0$ In some implementations, a positive trigger for the present of a critical object may be made where $\theta$ is determined to be in the "fourth quadrant" (e.g., the reactance decreases but the resistance increases). In some other implementations, this positive trigger may be made where $\theta$ is either in the "fourth quadrant" or within a few degrees of the "first quadrant"/"fourth quadrant" border within the "first quadrant." Moreover, since a human hand has been shown to change the impedance toward the "first quadrant" (e.g., the reactance and the resistance both increase), the present implementations can also discriminate the presence of living objects when the impedance is determined to have shifted toward the "first quadrant," more specifically, in a specific range of angles toward the "first quadrant."

Figure 16:
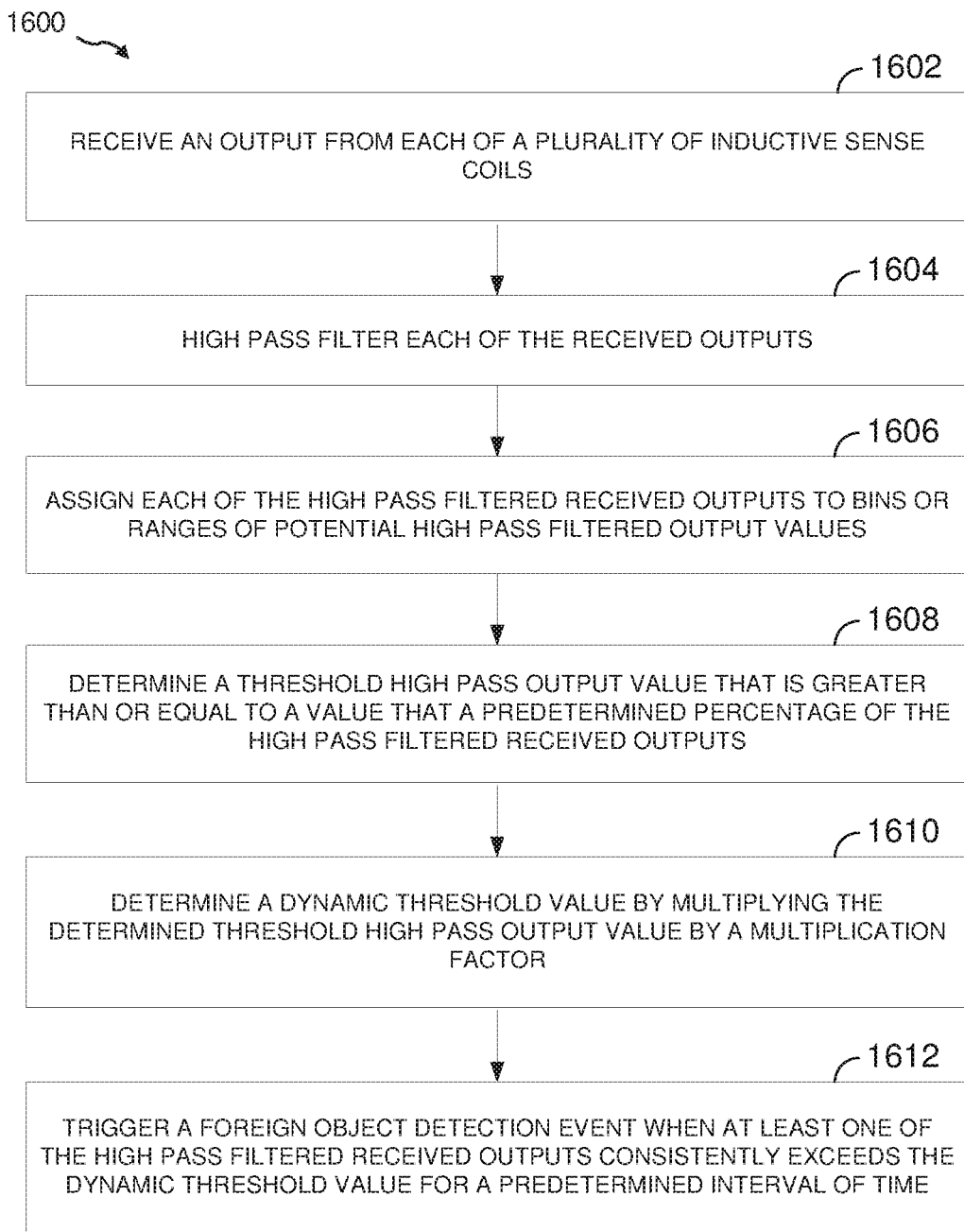
FIG. 16 is a flowchart of a method for detecting the presence of an object, in accordance with some implementations.

FIG. 16 is a flowchart 1600 of a method for detecting the presence of an object, in accordance with some implementations. Although the method 1600 is described herein with reference to the circuits and/or devices as discussed above with respect to FIGS. 4-14, a person having ordinary skill in the art will appreciate that the method 1600 may be implemented by other suitable devices and systems. Although the method 1600 is described herein with reference to a particular order, in various implementations, blocks herein may be performed in a different order, or omitted, and additional blocks may be added.

Operation block 1602 includes receiving an output from each of a plurality of inductive sense coils. For example, as previously described in connection with FIG. 14, an output or measurement signal may be received by each of a plurality of inductive sense coils arranged in an array on or over a base pad.

Operation block 1604 includes high pass filtering each of the received outputs. For example, a $1^{st}$ order Butterworth high pass filter may be applied to each of the output or measurement signals received from the plurality of inductive sense coils.

Operation block 1606 includes assigning each of the high pass filtered received outputs to bins or ranges of potential high pass filtered output values. For example, the high pass filtered outputs may be virtually or constructive arranged into a histogram. In this case, virtual or constructive may mean that a histogram may not explicitly be generated, however, the high pass filtered received outputs may be classified or grouped in a memory of a processor based on the range of output intensities within which each output falls.

Operation block 1608 includes determining a threshold high pass output value that is greater than or equal to a value that a predetermined percentage of the high pass filtered received outputs. For example, as previously described in connection with FIG. 14, a cumulative or normalized histogram line 1402 is determined such that the sum of the heights of all of the circles equals 1.0. Then, a percentile value is selected or determined, which indicates how many of the plurality of sense coils should be below some arbitrary high pass filtered output value.

Operation block 1610 includes determining a dynamic threshold value by multiplying the determined threshold high pass output value by a multiplication factor. For example, the determined threshold high pass output value is multiplied by a configuration parameter, or multiplication factor, in order to shift the dynamic threshold to a value that all high pass filtered outputs from the plurality of sense coils are expected to be below.

Operation block 1612 includes triggering a foreign object detection event when at least one of the high pass filtered received outputs consistently exceeds the dynamic threshold value for a predetermined interval of time. For example, as previously described in connection with FIG. 14, a foreign object detection event is triggered only after the significantly higher output consistently exceeds the dynamic threshold 1406 for a predetermined or adjustable interval of time (e.g., 1 second).

Figure 17:
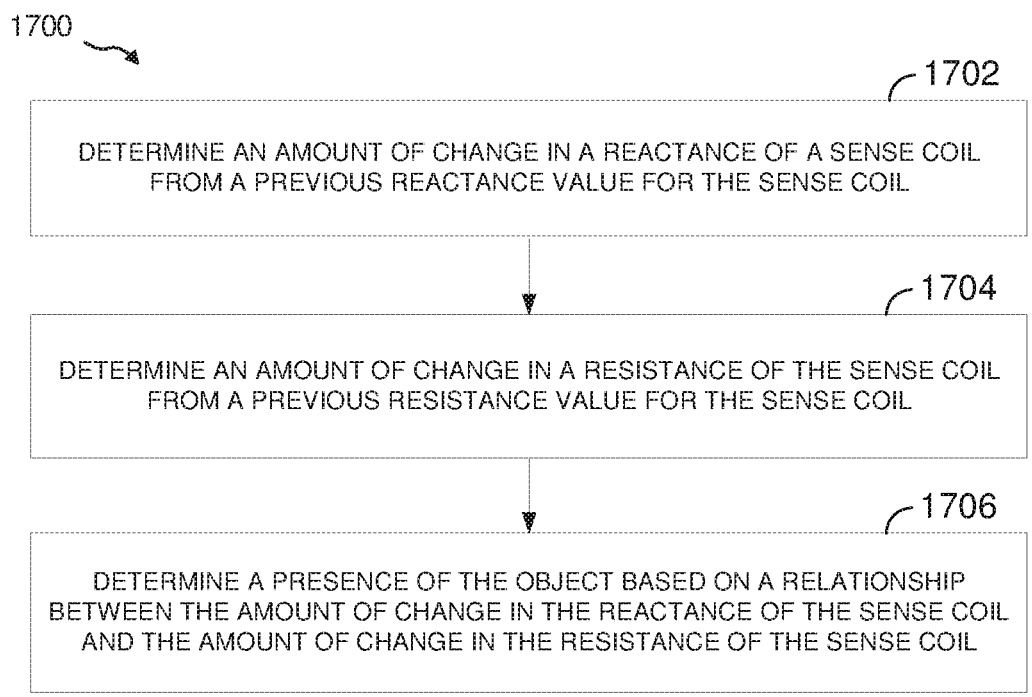
FIG. 17 is a flowchart of a method for detecting the presence of an object, in accordance with some implementations.

FIG. 17 is a flowchart 1700 of a method for detecting the presence of an object, in accordance with some implementations. Although the method 1700 is described herein with reference to the circuits and/or devices as discussed above with respect to FIGS. 4-14, a person having ordinary skill in the art will appreciate that the method 1700 may be implemented by other suitable devices and systems. Although the method 1700 is described herein with reference to a particular order, in various implementations, blocks herein may be performed in a different order, or omitted, and additional blocks may be added.

Operation block 1702 includes determining an amount of change in a reactance of a sense coil from a previous reactance value for the sense coil. For example, as previously described in connection with FIG. 15, a previous reactance value for each sense coil may be previously determined through calibration or manual setting of the reactance for that sense coil when no foreign object is present in the detection volume. The reactance of the sense coil may then be determined at any particular time and compared to the calibrated reactance for that sense coil when no foreign object is present. The difference between these two values is an amount of change in a reactance of the sense coil from the previous reactance value for that sense coil.

Operation block 1704 includes determining an amount of change in a resistance of the sense coil from a previous resistance value for the sense coil. For example, as previously described in connection with FIG. 15, a previous resistance value for each sense coil may be previously determined when no foreign object is present in the detection volume. The resistance of the sense coil may then be determined at any particular time and compared to the calibrated resistance for that sense coil when no foreign object is present. The difference between these two values is an amount of change in a resistance of the sense coil from the previous resistance value for that sense coil.

Operation block 1706 includes determining a presence of the object based on a relationship between the amount of change in the reactance of the sense coil and the amount of change in the resistance of the sense coil. For example, as previously described in connection with FIG. 15, the type of object present can be determined based essentially on a direction that the complex impedance of the sense coil shifts from the impedance of the sense coil when no objects are present in the detection volume. The type of object may be determined by a coarse determination of the direction of change in the reactance and the direction of change in the resistance of the sense coil. Alternatively, the type of object may be determined by performing an inverse tangent operation on a quotient of the amount of change in the reactance of the sense coil divided by the amount of change in the resistance of the sense coil and then determining a type of the object based on a result of the inverse tangent operation coinciding with a predetermined range of values corresponding to the type of the object.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations. For example, means for sensing an object may comprise any sense coil previously described in FIGS. 4-15. Means for determining an amount of change in a reactance of the means for sensing the object from a previous reactance value for the means for sensing the object may comprise any processor, for example, the impedance analyzer 1108 or evaluation & control unit 1140 of FIG. 11, the evaluation & control unit 1240 of FIG. 12, or the evaluation & control unit 1340 of FIG. 13. Similarly, means for determining an amount of change in a resistance of the means for sensing the object from a previous resistance value for the means for sensing the object may comprise any processor, for example, the impedance analyzer 1108 or evaluation & control unit 1140 of FIG. 11, the evaluation & control unit 1240 of FIG. 12, or the evaluation & control unit 1340 of FIG. 13. Means for determining a presence of the object based on a relationship between the amount of change in the reactance of the means for sensing the object and the amount of change in the resistance of the means for sensing the object may comprise any processor, for example, the evaluation & control unit 1140/1240/1340 of FIGS. 11-13, respectively.

Likewise, means for determining the presence of a living object when the amount of change in the reactance of the means for sensing the object is positive and the amount of change in the resistance of the means for sensing the object is positive may comprise any processor, for example, the evaluation & control unit 1140/1240/1340 of FIGS. 11-13, respectively. Means for determining the presence of a metallic object when the amount of change in the reactance of the means for sensing the object is negative and the amount of change in the resistance of the means for sensing the object is positive may comprise any processor, for example, the evaluation & control unit 1140/1240/1340 of FIGS. 11-13, respectively. Means for performing an inverse tangent operation on a quotient of the amount of change in the reactance of the means for sensing the object divided by the amount of change in the resistance of the means for sensing the object may comprise any processor, for example, the evaluation & control unit 1140/1240/1340 of FIGS. 11-13, respectively. Means for determining a type of the object based on a result of the inverse tangent operation coinciding with a predetermined range of values corresponding to the type of the object may comprise any processor, for example, the evaluation & control unit 1140/1240/1340 of FIGS. 11-13, respectively. Means for determining the type of the object as a metallic object or a living object based on the result of the inverse tangent operation coinciding with a predetermined range of values corresponding to metallic objects or a predetermined range of values corresponding to living objects may comprise any processor, for example, the evaluation & control unit 1140/1240/1340 of FIGS. 11-13, respectively.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and method steps described in connection with the implementations disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the implementations.

The various illustrative blocks, modules, and circuits described in connection with the implementations disclosed herein may be implemented or performed with a general purpose hardware processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose hardware processor may be a microprocessor, but in the alternative, the hardware processor may be any conventional processor, controller, microcontroller, or state machine. A hardware processor may also be implemented as a combination of computing devices, e.g., a combination of a DSP and a microprocessor, a plurality of microprocessors, one or more microprocessors in conjunction with a DSP core, or any other such configuration.

The steps of a method and functions described in connection with the implementations disclosed herein may be embodied directly in hardware, in a software module executed by a hardware processor, or in a combination of the two. If implemented in software, the functions may be stored on or transmitted as one or more instructions or code on a tangible, non-transitory, computer readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the hardware processor such that the hardware processor can read information from, and write information to, the storage medium. In the alternative, the storage medium may be integral to the hardware processor. Disk and disc, as used herein, includes compact disc (CD), laser disc, optical disc, digital versatile disc (DVD), floppy disk and blu ray disc where disks usually reproduce data magnetically, while discs reproduce data optically with lasers. Combinations of the above should also be included within the scope of computer readable media. The hardware processor and the storage medium may reside in an ASIC.

For purposes of summarizing the disclosure, certain aspects, advantages and novel features s have been described herein. It is to be understood that not necessarily all such advantages may be achieved in accordance with any particular implementation. Thus, the invention may be embodied or carried out in a manner that achieves or optimizes one advantage or group of advantages as taught herein without necessarily achieving other advantages as may be taught or suggested herein.

Various modifications of the above described implementations will be readily apparent, and the generic principles defined herein may be applied to other implementations without departing from the spirit or scope of the application. Thus, the present application is not intended to be limited to the implementations shown herein but is to be accorded the widest scope consistent with the principles and novel features disclosed herein.

What is claimed is:

1. An apparatus for detecting an object, comprising:
a sense coil configured to receive a voltage signal from a signal generator; and
a processor configured to:
determine an amount of change in a reactance measured at a sense frequency $f_s$, of the sense coil from a previous reactance value previously measured at the sense frequency $f_s$ for the sense coil,
determine an amount of change in a resistance of the sense coil from a previous resistance value for the sense coil,
perform a trigonometric operation on a ratio of the amount of change in the reactance of the sense coil to the amount of change in the resistance of the sense coil,
determine a type of the object based on a result of the trigonometric operation falling within a predetermined range of values corresponding to the type of the object and determine a presence of the object based on the trigonometric operation.

2. The apparatus of claim 1, wherein the processor is further configured to receive a signal from the sense coil, and wherein the reactance of the sense coil and the resistance of the sense coil are determinable from the received signal.

3. The apparatus of claim 2, wherein the processor is further configured to high pass filter the received signal from the sense coil.

4. The apparatus of claim 1, wherein the processor is further configured to determine the presence of a living object when the amount of change in the reactance of the sense coil is positive and the amount of change in the resistance of the sense coil is positive.

5. The apparatus of claim 1, wherein the processor is further configured to determine the presence of a metallic object when the amount of change in the reactance of the sense coil is negative and the amount of change in the resistance of the sense coil is positive.

6. The apparatus of claim 1, wherein the processor is configured to determine the type of the object as a metallic object or a living object based on the result of the trigonometric operation falling within a predetermined range of values corresponding to metallic objects or a predetermined range of values corresponding to living objects.

7. The apparatus of claim 1, wherein the processor is further configured to trigger a positive object detection event when the trigonometric operation satisfies a triggering criteria for a predetermined amount of time.

8. The apparatus of claim 1, wherein the previous reactance value for the sense coil is a reactance of the sense coil when no object is present and the previous resistance value for the sense coil is the resistance of the sense coil when no object is present.

9. An apparatus for detecting an object, comprising:
means for sensing an object configured to receive a voltage signal from a signal generator;
means for determining an amount of change in a reactance measured at a sense frequency $f_s$ of the means for sensing the object from a previous reactance value previously measured at the sense frequency $f_s$ for the means for sensing the object,
means for determining an amount of change in a resistance of the means for sensing the object from a previous resistance value for the means for sensing the object,
means for performing a trigonometric operation on a ratio of the amount of change in the reactance of the means for sensing the object to the amount of change in the resistance of the means for sensing the object;
means for determining a type of the object based on a result of the trigonometric operation falling within a predetermined range of values corresponding to the type of the object; and
means for determining a presence of the object based the trigonometric operation.

10. The apparatus of claim 9, further comprising means for determining the presence of a living object when the amount of change in the reactance of the means for sensing the object is positive and the amount of change in the resistance of the means for sensing the object is positive.

11. The apparatus of claim 9, further comprising means for determining the presence of a metallic object when the amount of change in the reactance of the means for sensing the object is negative and the amount of change in the resistance of the means for sensing the object is positive.

12. The apparatus of claim 9, further comprising means for determining the type of the object as a metallic object or a living object based on the result of the trigonometric operation coinciding with a predetermined range of values corresponding to metallic objects or a predetermined range of values corresponding to living objects.

* * * * *